United States Patent
Zediker

(10) Patent No.: US 11,870,203 B2
(45) Date of Patent: Jan. 9, 2024

(54) MULTI-WAVELENGTH VISIBLE LASER SOURCE

(71) Applicant: Nuburu, Inc., Centennial, CO (US)

(72) Inventor: Mark Zediker, Castle Rock, CO (US)

(73) Assignee: Nuburu, Inc., Centennial, CO (US)

( * ) Notice: Subject to any disclaimer, the term of this patent is extended or adjusted under 35 U.S.C. 154(b) by 0 days.

(21) Appl. No.: 16/695,090

(22) Filed: Nov. 25, 2019

(65) Prior Publication Data

US 2021/0057865 A1 Feb. 25, 2021

Related U.S. Application Data

(63) Continuation-in-part of application No. PCT/US2019/062884, filed on Nov. 23, 2019.

(Continued)

(51) Int. Cl.
*H01S 3/067* (2006.01)
*H01S 3/094* (2006.01)
(Continued)

(52) U.S. Cl.
CPC ........ *H01S 3/06708* (2013.01); *H01S 3/0675* (2013.01); *H01S 3/094046* (2013.01); *H01S 3/094069* (2013.01); *H01S 3/2391* (2013.01); *H01S 3/302* (2013.01); *H01S 3/09415* (2013.01); *H01S 3/094003* (2013.01)

(58) Field of Classification Search
CPC ............... H01S 3/2391; H01S 3/09415; H01S 3/094046; H01S 3/302
See application file for complete search history.

(56) References Cited

U.S. PATENT DOCUMENTS

| 4,288,678 A | 9/1981 | LaRocca |
| 4,679,198 A | 7/1987 | Shone |

(Continued)

FOREIGN PATENT DOCUMENTS

| CN | 1997936 A | * | 7/2007 | ........... H04N 9/3129 |
| CN | 103618207 A | * | 3/2014 | ........... H01S 3/1305 |

(Continued)

OTHER PUBLICATIONS

Glick et al., "High-Efficiency, 154 W CW, Diode-Pumped Raman Fiber Laser with Brightness Enhancement", Nov. 10, 2016, Applied Optics, vol. 56, No. 3, B97-B102 (Year: 2016).*

(Continued)

*Primary Examiner* — Joshua King
(74) *Attorney, Agent, or Firm* — Glen P. Belvis; Belvis Law, LLC.

(57) ABSTRACT

Methods and system to provide high power and brightness display and illumination systems and methods. In embodiments multi-wavelength laser beams in the wavelength range of 300 nm to 700 nm, including high power beams in these wavelengths having excellent beam qualities are provided and used. The three wavelengths can be primary colors, red, green and blue. Manufacturing and display systems, allowing the high-power white light generation directly from a single fiber laser source, such as theaters, sporting events, public events, private and home entertainment to name a few. The systems are configured for Photopic and Scotopic vision.

28 Claims, 18 Drawing Sheets
(18 of 18 Drawing Sheet(s) Filed in Color)

Related U.S. Application Data

(60) Provisional application No. 62/770,892, filed on Nov. 23, 2018.

(51) Int. Cl.
  *H01S 3/30* (2006.01)
  *H01S 3/23* (2006.01)
  *H01S 3/0941* (2006.01)

(56) References Cited

U.S. PATENT DOCUMENTS

| | | | |
|---|---|---|---|
| 4,847,479 A | 7/1989 | Clark | |
| 4,857,699 A | 8/1989 | Duley | |
| 4,879,449 A | 11/1989 | Duley | |
| 4,930,855 A | 6/1990 | Clark | |
| 4,960,973 A | 10/1990 | Fouch | |
| 4,973,819 A | 11/1990 | Thatcher | |
| 5,127,019 A | 6/1992 | Epstein | |
| 5,323,404 A * | 6/1994 | Grubb | H01S 3/0675 359/334 |
| 5,379,310 A | 1/1995 | Papen | |
| 5,392,308 A | 2/1995 | Welch | |
| 5,502,292 A | 3/1996 | Pernicka | |
| 5,526,155 A | 6/1996 | Knox | |
| 5,578,227 A | 11/1996 | Rabinovich | |
| 5,808,803 A | 9/1998 | Uliman | |
| 5,838,700 A * | 11/1998 | Dianov | C03C 17/32 372/6 |
| 5,903,583 A | 5/1999 | Uliman | |
| 5,923,475 A | 7/1999 | Kurtz | |
| 5,986,794 A | 11/1999 | Krause | |
| 5,987,043 A | 11/1999 | Brown | |
| 6,028,722 A | 2/2000 | Lang | |
| 6,124,973 A | 9/2000 | Du | |
| 6,129,884 A | 10/2000 | Beers | |
| 6,151,168 A | 11/2000 | Goering | |
| 6,163,554 A * | 12/2000 | Chang | H01S 3/302 372/6 |
| 6,175,452 B1 | 1/2001 | Uilmann | |
| 6,191,383 B1 | 2/2001 | Jense | |
| 6,192,062 B1 | 2/2001 | Sanchez-Rubio | |
| 6,208,679 B1 | 3/2001 | Sanchez-Rubio | |
| 6,212,310 B1 | 4/2001 | Waarts | |
| 6,251,328 B1 | 6/2001 | Beyer | |
| 6,301,273 B1 * | 10/2001 | Sanders | G02F 1/39 372/6 |
| 6,331,692 B1 | 10/2001 | Krausse | |
| 6,327,292 B1 | 12/2001 | Sanchez-Fubio | |
| 6,407,855 B1 * | 6/2002 | MacCormack | H01S 3/0812 359/346 |
| 6,575,863 B2 | 6/2003 | Piltch | |
| 6,584,133 B1 | 6/2003 | Walker | |
| 6,591,040 B1 | 7/2003 | Dempewolf | |
| 6,625,180 B2 * | 9/2003 | Bufetov | H01S 3/302 372/102 |
| 6,876,679 B1 | 4/2005 | Bowler | |
| 6,879,604 B2 * | 4/2005 | Cook | H01S 3/067 372/3 |
| 7,001,467 B2 | 2/2006 | Pique | |
| 7,006,549 B2 | 2/2006 | Anikitchev | |
| 7,024,117 B1 * | 4/2006 | Gottwald | H01S 3/302 359/341.42 |
| 7,034,992 B2 * | 4/2006 | Komine | G02B 6/02042 359/334 |
| 7,233,442 B1 | 6/2007 | Brown | |
| 7,570,856 B1 | 8/2009 | Minelly | |
| 7,765,022 B2 | 7/2010 | Mazumder | |
| 7,936,795 B2 * | 5/2011 | Emori | H01S 3/0675 372/3 |
| 7,959,353 B2 | 6/2011 | Anantharaman | |
| 8,049,966 B2 | 11/2011 | Chann | |
| 8,130,807 B2 | 3/2012 | Schulz-Harder | |
| 8,488,245 B1 | 7/2013 | Chann | |
| 8,520,311 B2 | 8/2013 | Krause | |
| 8,553,327 B2 | 10/2013 | Chann | |
| 8,559,107 B2 | 10/2013 | Chann | |
| 8,670,180 B2 | 3/2014 | Chann | |
| 8,724,222 B2 | 5/2014 | Chann | |
| 9,093,822 B1 | 7/2015 | Chann | |
| 9,172,208 B1 | 10/2015 | Dawson | |
| 9,104,029 B1 | 11/2015 | Tayebati | |
| 9,178,333 B2 | 11/2015 | Tayebati | |
| 9,190,807 B2 | 11/2015 | Tayebati | |
| 9,203,209 B2 | 12/2015 | Ramachandran | |
| 9,209,605 B1 | 12/2015 | Guo | |
| 9,256,073 B2 | 2/2016 | Chann | |
| 9,268,097 B2 | 2/2016 | Huang | |
| 9,268,142 B2 | 2/2016 | Chann | |
| 9,310,560 B2 | 4/2016 | Chann | |
| 9,647,418 B1 | 5/2017 | Henry | |
| 10,263,386 B1 * | 4/2019 | Sridhar | G02F 1/3536 |
| 2001/0023921 A1 | 9/2001 | Mano | |
| 2002/0126956 A1 * | 9/2002 | Bouteiller | G02B 6/02204 385/37 |
| 2002/0145793 A1 * | 10/2002 | Bock | H01S 3/302 359/334 |
| 2002/0149137 A1 | 10/2002 | Jang | |
| 2003/0030756 A1 * | 2/2003 | Kane | H04N 9/3132 348/744 |
| 2003/0048819 A1 | 3/2003 | Nagano | |
| 2003/0052105 A1 | 3/2003 | Nagano | |
| 2003/0063631 A1 | 4/2003 | Corcoran | |
| 2003/0142393 A1 | 7/2003 | Kuksenkov | |
| 2004/0027631 A1 | 2/2004 | Nagano | |
| 2004/0056006 A1 | 3/2004 | Jones | |
| 2004/0086004 A1 * | 5/2004 | Bonaccini | H01S 3/094015 372/6 |
| 2004/0156401 A1 | 8/2004 | Sandrock | |
| 2004/0173587 A1 | 9/2004 | Musselman | |
| 2004/0179797 A1 * | 9/2004 | Po | H01S 3/302 385/123 |
| 2004/0213300 A1 * | 10/2004 | Cook | H01S 3/30 372/3 |
| 2004/0036242 A1 | 12/2004 | Orozco | |
| 2004/0240487 A1 * | 12/2004 | Borne | H01S 3/302 372/3 |
| 2004/0254474 A1 | 12/2004 | Seibel | |
| 2005/0173385 A1 | 8/2005 | Smart | |
| 2005/0207466 A1 | 9/2005 | Glebov | |
| 2005/0248820 A1 | 11/2005 | Moser | |
| 2006/0160332 A1 | 7/2006 | Gu | |
| 2007/0041083 A1 | 2/2007 | Di Teodoro | |
| 2007/0047066 A1 * | 3/2007 | Green | H01S 3/302 359/326 |
| 2007/0078449 A1 * | 4/2007 | Hayashi | A61B 18/22 606/10 |
| 2007/0189338 A1 | 8/2007 | Seelert | |
| 2008/0013574 A1 * | 1/2008 | Furuya | H04N 9/3129 372/6 |
| 2008/0085368 A1 | 4/2008 | Abe | |
| 2009/0051935 A1 | 2/2009 | Cooper | |
| 2009/0190218 A1 | 7/2009 | Govorkov | |
| 2009/0201309 A1 * | 8/2009 | Demos | G01J 3/50 345/589 |
| 2009/0225793 A1 | 9/2009 | Marciante | |
| 2009/0296743 A1 | 12/2009 | Islam | |
| 2010/0110556 A1 | 5/2010 | Chann | |
| 2010/0142564 A1 | 6/2010 | Jhang | |
| 2010/0220294 A1 | 9/2010 | Mizuuchi | |
| 2010/0284659 A1 * | 11/2010 | Nicholson | H01S 3/0675 385/127 |
| 2010/0290106 A1 * | 11/2010 | DiGiovanni | H01S 3/06733 359/334 |
| 2011/0122482 A1 * | 5/2011 | Mead | H01S 3/0675 359/327 |
| 2011/0129615 A1 | 6/2011 | Renn | |
| 2011/0134510 A1 * | 6/2011 | Lippey | G02F 1/37 359/327 |
| 2011/0175925 A1 * | 7/2011 | Kane | H04N 21/42202 345/589 |
| 2011/0205349 A1 | 8/2011 | Li | |
| 2011/0216792 A1 | 9/2011 | Chann | |

(56) References Cited

U.S. PATENT DOCUMENTS

| | | | |
|---|---|---|---|
| 2011/0254974 A1* | 10/2011 | Daisuke | H04N 9/735 348/223.1 |
| 2011/0267671 A1 | 11/2011 | Peng | |
| 2011/0311389 A1 | 12/2011 | Ryan | |
| 2012/0012570 A1 | 1/2012 | Briand | |
| 2012/0285936 A1 | 11/2012 | Urashima | |
| 2013/0028276 A1 | 1/2013 | Minelly | |
| 2013/0071738 A1 | 3/2013 | Wang | |
| 2013/0148673 A1 | 6/2013 | Creeden | |
| 2013/0162952 A1* | 6/2013 | Lippey | G02B 27/48 353/7 |
| 2013/0188243 A1* | 7/2013 | Nicholson | H01S 3/08013 359/334 |
| 2013/0265498 A1* | 10/2013 | Asakawa | G03B 21/2086 348/649 |
| 2013/0269748 A1 | 10/2013 | Wiedeman et al. | |
| 2013/0299474 A1* | 11/2013 | Kashiwagi | B23K 26/042 219/121.81 |
| 2014/0023098 A1 | 1/2014 | Clarkson | |
| 2014/0086539 A1 | 3/2014 | Sorraa | |
| 2014/0112357 A1 | 4/2014 | Abedin | |
| 2014/0249495 A1 | 9/2014 | Mumby et al. | |
| 2014/0252687 A1 | 9/2014 | El-Dasher | |
| 2014/0254614 A1 | 9/2014 | Nicholson | |
| 2015/0033343 A1 | 1/2015 | Jiang | |
| 2015/0136840 A1 | 5/2015 | Zhao | |
| 2015/0165556 A1 | 6/2015 | Gordon | |
| 2015/0188283 A1* | 7/2015 | Ramachandran | H01S 3/06725 372/6 |
| 2015/0214692 A1* | 7/2015 | Miyato | H01S 3/0675 372/6 |
| 2015/0277003 A1* | 10/2015 | Sanchez Ramos | G02B 19/0066 345/697 |
| 2015/0333473 A1 | 11/2015 | Gapontsev | |
| 2016/0067780 A1 | 3/2016 | Nuburu | |
| 2016/0067827 A1* | 3/2016 | Zediker | B23K 26/144 219/76.12 |
| 2016/0178985 A1* | 6/2016 | Ruan | H01S 3/2383 385/11 |
| 2016/0190764 A1* | 6/2016 | Guo | H01S 3/108 372/6 |
| 2016/0322777 A1* | 11/2016 | Zediker | H01S 5/405 |
| 2016/0336714 A1 | 11/2016 | Zimer | |
| 2017/0021454 A1 | 1/2017 | Dallarosa | |
| 2017/0025814 A1* | 1/2017 | Xiong | H01S 3/094003 |
| 2017/0214213 A1* | 7/2017 | Zediker | E21B 7/14 |
| 2017/0294754 A1* | 10/2017 | Leonardo | G02F 1/3532 |
| 2017/0336714 A1 | 11/2017 | Arnz | |
| 2017/0341144 A1 | 11/2017 | Nuburu | |
| 2017/0341180 A1 | 11/2017 | Nuburu | |
| 2017/0343729 A1* | 11/2017 | Zediker | G02B 6/12 |
| 2017/0357148 A1* | 12/2017 | Nose | H04N 9/3114 |
| 2018/0098041 A1* | 4/2018 | Lawrence | H04N 21/43637 |
| 2018/0233878 A1* | 8/2018 | Leonardo | G03B 21/2033 |
| 2018/0236605 A1 | 8/2018 | Finuf et al. | |
| 2018/0375296 A1 | 12/2018 | Nuburu | |
| 2019/0025502 A1 | 1/2019 | Nuburu | |
| 2019/0089983 A1 | 5/2019 | Nuburu | |
| 2019/0129291 A1* | 5/2019 | D'Oosterlinck | G03B 21/2053 |
| 2019/0273365 A1 | 9/2019 | Nuburu | |
| 2019/0361171 A1 | 11/2019 | Nuburu | |
| 2020/0086388 A1 | 3/2020 | Nuburu | |
| 2020/0094478 A1 | 3/2020 | Nuburu | |
| 2020/0206844 A1 | 7/2020 | Nuburu | |
| 2021/0057865 A1* | 2/2021 | Zediker | H01S 3/094046 |
| 2021/0399519 A1 | 12/2021 | Nuburu | |
| 2022/0140572 A1 | 5/2022 | Nuburu | |

FOREIGN PATENT DOCUMENTS

| | | | | |
|---|---|---|---|---|
| CN | 104742376 | | 7/2015 | |
| CN | 107425406 A | * | 12/2017 | |
| CN | 111697420 A | * | 9/2020 | H01S 3/06758 |
| DE | 102013011676 | | 1/2013 | |
| EP | 1437882 | | 7/2004 | |
| EP | 3307525 | | 4/2018 | |
| EP | 3307526 | | 4/2018 | |
| EP | 9886335.9 | | 12/2022 | |
| FR | 2932320 A1 | * | 12/2009 | H01S 3/302 |
| JP | 2000075150 A | * | 3/2000 | H01S 3/302 |
| JP | 6225263 | | 6/2015 | |
| KR | 1020180017080 A | | 12/2016 | |
| KR | 1020180017081 A | | 12/2016 | |
| KR | 10-2018-703763 | | 8/2019 | |
| RU | 2017108455 A | * | 10/2018 | G03B 21/2033 |
| WO | WO-2005081430 A2 | * | 9/2005 | H01S 3/06754 |
| WO | WO-2010132482 A1 | * | 11/2010 | H01S 3/06733 |
| WO | WO 2013/106456 | | 7/2013 | |
| WO | WO-2014089544 A2 | * | 6/2014 | H01S 3/302 |
| WO | PCT/US2014/035928 | | 8/2014 | |
| WO | WO 2015134075 | | 9/2014 | |
| WO | WO 2014/179345 | | 11/2014 | |
| WO | WO-2015057482 A1 | * | 4/2015 | H01S 3/08022 |
| WO | PCT/US2015/047226 | | 8/2015 | |
| WO | WO-2015140901 A1 | * | 9/2015 | H01S 3/30 |
| WO | WO-2016044395 A1 | * | 3/2016 | G02B 27/48 |
| WO | WO-2016044422 A1 | * | 3/2016 | H04N 13/334 |
| WO | PCT/US2016/042363 | | 12/2016 | |
| WO | WO 2016/203998 | | 12/2016 | |
| WO | WO 2016201309 | | 12/2016 | |
| WO | WO 2016201326 | | 12/2016 | |
| WO | PCT/US2017/030175 | | 7/2017 | |
| WO | PCT/US2017/030059 | | 12/2017 | |
| WO | PCT/US2017/030088 | | 12/2017 | |
| WO | PCT/2018/016119 | | 4/2018 | |
| WO | PCT/US2018/028698 | | 7/2018 | |
| WO | WO-2020020705 A1 | * | 1/2020 | H01S 3/063 |
| WO | PCT/US2019/063112 | | 4/2020 | |

OTHER PUBLICATIONS

Liu et al., "Selective Transverse Mode Operation of an All-Fiber Laser with a Mode-Selective Fiber Bragg Grating Pair", Dec. 7, 2016, Optics Letters, vol. 41, No. 24, 5692-5695. (Year: 2016).*

2012, Jürgen Bertling, DDM—An Approach Towards Sustainable Production?.

1998, Dongping Shi, Surface Finishing of Selective Laser Sintering Parts w/ Robot.

Aug. 18, 2017, Johannes Trapp, In situ absorptivity measurements of metallic powders during laser powder-bed fusion additive manufacturing.

Dec. 1, 2006, GSI, CRS Series—Resonant Ontical Scanners.

2009, Newport Corporation, Workstation for Laser Direct-Write Processing 39.

2004, 3D Systems Inc, Sinterstation HIQ Series—SLS Systems Brochure.

2003, Raymond M. Karam, A New 30, Direct Write, Sub-Micron Microfabrication Process that Achieves True Optical, Mechatronic and Packaging Integration on Glass-Ceramic Substrates.

2010, 3D System Inc, iPro 8000 & 9000 Brpchure.

2002, J.A. Ramos, Surface Over-Melt during Laser Polishing of Indiect-SLS Metal Parts.

2012, 3D Systems Inc, sPro 125 and sPro 250—Direct Metal SLM Production Printer.

2012, 3D Systems Inc, sPro Family Brochure.

2001, J.A. Ramos, Surface Roughness Enhancement of Indirect-SLS Metal Parts by Laser Surface Polishing.

1993, William T. Carter, Direct Laser Sintering of Materials.

2012, Object Ltd., 10 Reasons Why Multi-Material 3D Printing is Better for your Product Design & Development.

Nov. 2012, Concept Laser, X line 100R—Metal laser Melting System.

Nov. 13, 2014, Fraunhofer ILT, Selective Laser Melting Press Relealse.

Sep. 21, 2017, 3D Print.com, Nuburu blue laser system.

2016, Wave Spectrum Laser, Inc, 405nm 6W Laser System.

(56) References Cited

OTHER PUBLICATIONS

2016, Wave Spectrum Laser, Inc, Package—High Power LD—650 nm LD 1000mW High Power—C Mount Package Laser Diodes.
Aug. 2005, Larry Johnson, Laser Diode Burn-In and Reliability Testing.
Nov. 17, 2012, Nobuyasu Suzuki, 10 W CW blue-violet diode laser array on the micro-channel cooler.
2016, Crysta Laser, Diode pumped 473 nm blue Crysta Laser.
2014, Coherent, Inc, HighLight 1000FL—1kW Industrial OEM Fiber Laser.
2007, Chong Cook Kim, Degradation Modes of inGaN Blue-Violet Laser Diodes—Grown on Bulk GaN Wafers.
2013, Andreas Unger, High-power fiber-coupled 100 W visible spectrum diode lasers for display applications.
2016, DILAS Industrial Laser Systems, Compact (Blue) Diode Laser.
2016, Crysta Laser, Stabilized 375/405/445/456/473/390-488nm Violet-blue Lasers.
2013, C. P. Gonschior, High power 405 nm diode laser fiber-coupled single-made system with high long-term stability.
2013, Torrey Hills Technologies, LLC, Understanding of Laser, Laser diodes, Laser diode packaging and it's relationship to Tungsten Copper.
Mar. 15, 1996, Helms, Life tests of Nichia AlGaN/InGaN/GaN blue-light—emitting diodes (Sandia National Laboratories).
Sep. 3, 1997, Melanie Ott, Capabilities and Reliability of LEDs and Laser Diodes.
2008, nLight, Singel Emitter Diode Laser Devices (Visible).
Jan. 2000, Shuji Nakamura, Current Status and Future prospects of inGaN—Based Laser Diodes.
Jan. 2012, IPG Photogenics, YLM Fiber Laser-Single Mode Series.
2004, François Gonthier, High-power All-fiber components: The missing link for high power fiber lasers.
May/Jun. 2007, Thomas H. Loftus, Spectrally Beam-Combined Fiber Lasers for High Average—Power Applications.
2010, Christophe A. Codemard, 100 W CW Cladding-Pumped Raman Fiber Laser at 1120 NM.
2007, Nathan B. Terry, Raman Fiber Lasers and Amplifiers Based on Multimode Graded-Index Fibers and Their Application to Beam Cleanup.
Jun. 1997, I. K. Ilev, Ultraviolet and blue discretely tunable-pass fiber Raman laser.
2004, Qin, Blue Up-Conversion Fibre Laser Pumped by a 1120-nm Raman Laser.
Jun. 24, 2010, John E. Heebner, High Brightness, quantum-defect-limited conversion efficiency in cladding-pumped Raman fiber amplifiers and oscilators.
2015, Huawei Jiang, Cascaded-cladding-pumped cascaded Raman fiber amplifier.
Feb. 2007, Christophe Andre Codemard, High-Power Cladding-Pumped Raman and Erbium-Ytterbium Doped Fibre Solutions
1942, CV Raman, The Physcis of the Diamond.
Aug. 2011, Ondrej Kitzler, CW Diamond laser architecture for high average power raman beam conversion.
Oct. 1, 2014, N. V. Surovtsev, Temperature Dependence of the Raman line width in diamond: Revisited.
2012, Vasili G. Savitski, Steady-State Raman Gain in Diamond as a Function of Pump Wavelength.
2011, Jean-Philippe M. Feve, High average power diamond Raman laser.
Nov. 20, 2015, Tianfu Yao, High-power Continuous-Wave Directly-Diode-Pumped Fiber Raman Lasers.
Jun. 1, 2008, Arman B. Fallahkhair, Vectore Finite Difference Modesolver for Anisoptropic Dielectric Waveguides.
Jan. 2011, Jean-philippe Feve, High average power diamond Raman laser.
Jan. 2016, Ekaterina A. Zlobina, Singlemode Raman Lasing in Graded-Index Fiber Pumped by High-Power 915-nm Laser Diode.
Jun. 2016, Yaakov Glick, High power, high efficiency diode pumped Raman fiber laser.
Nov. 2015, Yao, High-Power Continuous-Wave Directly-Diode-Pumped Fiber Raman Lasers.
2004, R.P. Mildren, Efficient, all-solid-state, Raman laser in the yellow, orange, and red.
Nov. 11, 1992, Katsusuke Tajima, Low Rayleigh Scattering P2 O5-F-Si O2 Glasses.
Aug. 1, 1976, K.O. Hill, Low-threshold cw Raman laser.
Jan. 2017, Ekaterina A. Zlobina, graded-index fiber directly pumped by a multimode laser diode.
Nov. 18, 2003, Shenghong Huang, Generation of 10.5 W 1178 nm Laser Based on Phosphosilicate Raman Fiber Laser.
Aug. 10, 2015, Hongxin Su, Investegation of Stimulated Raman Scattering in a Phosphorus-doped silica fiber.
2017, Aaron McKay, Diamond-based Concept for combining beams at very high average powers.
Jun. 1997, I. K. Ilev, Ultraviolet and blue discretely tunable double-pass fiber Raman laser.
Nov. 7, 2004, V.A. Lisinetskii, Raman Gain Coefficient of Barium Nitrate Measured for the Spectral Region of TI: Sapphire Laser.
Dec. 2003, Nathan R. Newbury, Pump-Wavelength Dependence of Raman Gain in Single Mode Optical Fibers.
Jan. 1, 2014, CPT, Reduced Mode Sapphire Optical Fiber and Sensing System.
Jul. 15, 2002, N.R. Newbury, Raman gain: pump-wavelength dependence in single-mode fiber.
Jan. 2016, Ekaterina A. Zlobina, Raman Lasing in GRIN Fibers with 915-nm Diode Pumping.
May/Jun. 2002, Mohammed N. Islam, Raman Amplifiers for Telecommunications.
Aug. 2005, A. Marf́inez Rios, Analytical approach for the design of cascaded raman fiber lasers.
Nov. 11, 2000, Kyozo Tsujikawa, Rayleigh Scattering Reduction Method for Silica-Based Optical Fiber.
2005, Clara Rivero, Resolved discrepancies between visible Spontaneous Raman cross-Section and direct near-infrared Raman gain measurements in TeO2-.
Aug. 20, 1997, Rick K. Nubling, Optical properties of single-crystal sapphire fibers.
2014, Yves Colombe, Single-mode Optical fiber for high-power, low-loss UV transmission.
Jan. 2015, David J Spence, Spatial and Spectral Effects in Continuous Wave Intracavity Raman Lasers.
Apr. 2014, Bonner, Spectral broadening in Continuous-wave intracavity Raman lasers.
May 30, 2013, A.A. Lanin, The phase-controlled Raman effect.
2006, Robert Anthony Michael Stegeman, Direct Nonlinear Optics Measurements of Raman Gain in Bulk Glasses And Estimates of Fiber Performanc.
2007, Nathan B. Terry, graded-index multimode fiber for SRS beam combinaton.
May 15, 2005, V.G. Plotnichenko, Raman band intensities of tellurite glasses.
Nov. 23, 2000, P.A. Champert, Tunable, broad visible Range, fibre-based Raman Source.
Apr. 2012, Christian Agger, Supercontinuum generation in ZBLAN fibers-detailed comparison between measuremnt and simulation.
1997, Keming Du, Fiber-coupling technique with micro step-mirros for high-power diode laser bars.
1999, C.C. Cook, Spectral Beam Combing of Yb-doped Fiber Lasers in an External Cavity.
Aug. 1977, W.J. Tomlinson, Wavelength multiplexing in multimode optical fibers.
1996, Shih-Hsiang Hsu, External Cavity Laser Array with Monolithically Integrated Glass Waveguide and Rowland Circle.
1999, Jason N. Farmer, Incoherent Beam Combination of Diode Laser Bars.
1998, H.G. Treusch, Fiber-Coupling technique for high-power diode laser arrays.
2012, Y. Xiao, 1-Kilowatt CW all-fiber laser oscillator pumped with wavelength-beam-combined diode stacks.
Feb. 15, 2007, Robin K. Huang, High-Brightness Wavelength Beam Combined Semiconductor Laser Diode Arrays.

(56) References Cited

OTHER PUBLICATIONS

May/Jun. 2005, T.Y. Fan, Laser Beam Combining for High-Power, High-Radiance Sources.
2006, B. Chann, High-Brighness Wavelength-Beam-Combined Diode Laser Stcks Using a Volume Bragg Grating (VBG).
May 2002, Erik J. Bochove, Theory of Spectral Beam Combining of Fiber Lasers.
2001, A.K. Goyal, Wavelength Beam Combining of Mid-IR Semi-conductor Lasers.
Mar./Apr. 2009, Oleksiy Andrusyak, Spectral Combining and Coherent coupling of Lasers by Volume Bragg Gratings.
Apr. 2005, Dennis Lowenthal, Across the Spectrum: Combining laser emitters yields a high-power source with a useful beam.
Jun. 18, 2003, Steven C. Tidwell, Spectral beam combining of diode laser bars achieve effiecient near diffraction limited output power (Abstract only).
Jun. 1, 2004, Charles E. Hamilton, High-power laser source with spectrally beam-combined diode laser bars (abstract only).
2011, Sims, Spectral beam combining of 2 um Tm fiber laser systems.
2011, Lee, Benjamin G, Wavelength beam combining of quantum cascade laser arrays for remote sensing.
1999, C.C. Cook, Spectral Beam Combining of Yb-doped Fiber Lasers in External Cavity.
2007, Oleksiy Andrusyak, Power Scaling of Laser Systems Using Spectral Beam Combining with Volume Bragg Gratings in PTR Glass.
1988, David L. Begley, Aperture Shared Laser diode array beam combiner.
1999, Jason N. Farmer, 50 x improvement in diode beam quality.
2008, Juliet T. Gopinath, 1450-nm high-brightness wavelength-beam combined diode laser array.
1993, G.C. Papen, Multiple-wavelength operation of a laser-diode array coupled to an external cavity.
1997, H. Tanobe, OFC '97 Technical Digest—A four-channel multiwavelengthfibergrating external—cavity-laser.
1997, Martin Zirngibl, OFC '97 Technical Digest—Multiple wavelength sources, detectors, and routers.
Aug. 77, W.J. Tomlinson, Wavelength multiplexing in multimode optical fibers.
Nov. 23, 2014, Jeff Hecht, Photonic Frontiers: beam combining.
2007, Oleksiy Andrusyak, Power Scaling of Laser Systems Using Spectral Beam Combining with Volue Bragg Gratings in PTR Glass.
2011, R. Andrew Sims, Spectral beam combining of 2 um Tm fiber laser systems.
Feb. 10, R. Andrew Sims, Spectral beam combining of thulim fiber laser systems (abstract only).
Apr. 20, 1987, Chandrasekhar Roychoudhuri, Laser Beam Combining Technology (abstract only).
Jan./Feb. 2001, Shu Namiki, Ultrabroad-Band Ramgn Amplifiers Pumped and Gain-Equalized by Wavelength -Division-.
Oct. 8, L.A. Ribeiro, Spontaneous Raman Scattering in Optica Fiber: Experimental Measurement, AIP Conference Proceedings 1055, 159 (2008).

\* cited by examiner

Table I

| Raman Frequency Shifts | Silica | GeO2 | Phosphorus |
|---|---|---|---|
| Delta Lambda (cm-1) | 440 | 440 | 1330 |
| 1st Stokes | 4.59E-05 | 4.59E-05 | 4.79E-05 |
| 2nd Stokes | 4.69E-05 | 4.69E-05 | 5.11E-05 |
| 3rd Stokes | 4.78E-05 | 4.78E-05 | 5.48E-05 |
| 4th Stokes | 4.89E-05 | 4.89E-05 | 5.92E-05 |
| 5th Stokes | 4.99E-05 | 4.99E-05 | 6.42E-05 |
| 6th Stokes | 5.11E-05 | 5.11E-05 | 7.02E-05 |
| 7th Stokes | 5.22E-05 | 5.22E-05 | 7.74E-05 |
| 8th Stokes | 5.35E-05 | 5.35E-05 | 8.63E-05 |
| 9th Stokes | 5.48E-05 | 5.48E-05 | 9.75E-05 |
| 10th Stokes | 5.61E-05 | 5.61E-05 | |
| 11th Stokes | 5.75E-05 | 5.75E-05 | |
| 12th Stokes | 5.90E-05 | 5.90E-05 | |
| 13th Stokes | 6.06E-05 | 6.06E-05 | |
| 14th Stokes | 6.23E-05 | 6.23E-05 | |
| 15th Stokes | 6.40E-05 | 6.40E-05 | |
| 16th Stokes | 6.59E-05 | 6.59E-05 | |
| 17th Stokes | 6.78E-05 | 6.78E-05 | |

FIG. 17

Table II

| Raman Frequency Shifts | Diamond | KGW | YVO4 | Ba(NO3)2 |
|---|---|---|---|---|
| Delta Lambda (cm-1) | 1332 | 901 | 892 | 1047 |
| 1st Stokes | 4.79E-05 | 4.69E-05 | 4.69E-05 | 4.72E-05 |
| 2nd Stokes | 5.11E-05 | 4.90E-05 | 4.89E-05 | 4.97E-05 |
| 3rd Stokes | 5.49E-05 | 5.12E-05 | 5.12E-05 | 5.24E-05 |
| 4th Stokes | 5.92E-05 | 5.37E-05 | 5.36E-05 | 5.55E-05 |
| 5th Stokes | 6.44E-05 | 5.64E-05 | 5.63E-05 | 5.89E-05 |
| 6th Stokes | 7.03E-05 | 5.95E-05 | 5.93E-05 | 6.27E-05 |
| 7th Stokes | 7.75E-05 | 6.28E-05 | 6.26E-05 | 6.71E-05 |
| 8th Stokes | 8.65E-05 | 6.66E-05 | 6.63E-05 | 7.22E-05 |
| 9th Stokes | 9.77E-05 | 7.09E-05 | 7.05E-05 | 7.81E-05 |

FIG. 18

MULTI-WAVELENGTH VISIBLE LASER SOURCE

This application: (i) claims priority to and the benefit of the filing date of U.S. provisional application Ser. No. 62/770,892 filed Nov. 23, 2018; and, (ii) is a continuation-in-part of PCT/US2019/062884 filed Nov. 23, 2019, which claims priority to and the benefit of the filing date of US provisional application Ser. No. 62/770,892 filed Nov. 23, 2018, the entire disclosure of each of which is incorporated herein by reference.

BACKGROUND OF THE INVENTION

Field of the Invention

The present inventions relate to lasers that produce multi-wavelength laser beams in the wavelength range of 300 nm to 700 nm, including high power beams in these wavelengths having excellent beam qualities. Embodiments of these methods and systems can be applied, among other areas, to a wide range of manufacturing, projection and display systems. Embodiments of these methods provide systems providing high-power white light generation directly from a single fiber laser source.

Prior to the present inventions, laser beams in the 300-700 nm range are typically obtained from a diode laser source or using frequency doubling of a near infrared or infrared laser. These laser sources can individually create a predetermined wavelength, but they cannot provide a series of broadly spaced wavelengths. While these systems can produce a band of closely spaced wavelengths or a wavelength bandwidth, they cannot produce a group or series of individual wavelengths. To date, in general and in particular for commercially viable systems, the art has been unable to scale these types of lasers to make higher powers, e.g., lasers greater than 500 W (0.5 kW) and in particular 1 kW and greater that have the necessary reliability for the industrial environment. Furthermore, it is believed to be impossible to replicate the commercial capabilities of embodiments of the present inventions, because of the complexity and difficulty in integrating the multiple individual lasers operating on multiple individual wavelengths that are then combined in an attempt to accomplish the same objectives. It is believed that such a combination has not been made to date. This inability to obtain high power lasers in these wavelengths is generally believed in the art to be limited by the non-linear crystal's ability to handle the heat load and power densities required at high power levels among other things. As a consequence, the highest power, high beam quality laser available by frequency doubling is presently believed to be limited to about 400 Watts (0.4 kW) pulsed. The pulsing is required to manage the heat load on the crystal. It is believed that commercially viable or useful lasers in the 300-700 nm range operating at either a single wavelength or multiple wavelengths, having high powers, e.g., 1 kW and greater, and having high beam quality, e.g., $M^2=\sim1$, $M^2<1.05$, $M^2<1.1$, $M^2<1.25$, $M^2<1.5$, for all axes, have not been obtained, prior to the present inventions.

Prior to embodiments of the present inventions, and those described in pending applications of Nuburu, it is believed that there were generally four types of blue lasers. Blue lasers are those that have wavelengths in the range of about 400-505 nm, and typically 405-495 nm. These blue lasers are: (i) He:Cd, (ii) Ar-ion, (iii) diode laser direct and frequency doubled, and (iv) solid state doubled or parametric oscillators.

(i) He:Cd lasers are single mode but limited in power to a few hundred milli-Watts, e.g., 0.0001 kW. He:Cd lasers are typically single transverse mode, but due to the low efficiency of these lasers (<0.025%) it is very difficult to scale these lasers to high power levels, consequently, they are not suitable for high power material processing applications.

(ii) Ar-ion lasers are very inefficient, and as a consequence are limited to relatively lower power, less than about 0.005 kW multi-lines. These lasers, at these low powers, are single transverse mode with multiple wavelengths operating. Lifetime of these systems are typically, <5,000 hours which is relatively short for most industrial applications.

(iii) Blue diode lasers are becoming available. They however are low power, typically less than 0.0025 kW, and have poor beam quality, e.g., $M^2>5$ in the slow axis and $M^2=\sim1$ in the fast axis. The devices today have lifetimes on the order of 20,000 hours and are suitable for many industrial and commercial laser applications. When scaling these devices up to 200 Watts or more, the beam quality decreases with each incremental increase in power. For example at 200 Watts, the $M^2>50$.

(iv) Frequency doubled blue laser sources are typically limited to about 0.50 kW or so output power. The methods for creating blue light can be either frequency doubling a 800s (eight hundreds range)-900s nm range light source or using sum-frequency mixing of two different wavelengths to generate a third. Either technique requires the use of a non-linear doubling crystal such as Lithium Niobate or KTP. These crystals are relatively short and as a consequence, they require high peak power levels to achieve efficient conversion. When operating in a CW mode, thermal issues as well as charge migration issues can result in the rapid degradation of the crystal and consequently, the output power of the laser.

Prior to the present inventions, blue wavelength laser beams were typically obtained by parametric oscillators, four-wave mixing and direct doubling. These are all inefficient processes that rely on the use of a non-linear crystal to achieve the blue wavelength. These crystals are incapable of managing the heat loads that occur when laser power approaches a few 100 W (0.1 kW) CW, let alone a kW and greater powers.

It is believed that these prior types of blue, and in general visible lasers and the laser beams they provided are inadequate for high power display applications where multiple wavelengths from a single laser source would enable brilliant large screen projection in a compact commercially viable system. High power frequency doubled laser sources are typically rapidly pulsed sources, with very high peak powers and very short pulses. These very short pulses are difficult to make a viable display, so designers using this approach typically use a more efficient method of frequency doubling by going to a long pulse through the doubling crystal. The greater the pulse length, the higher the heat load and the closer the operating characteristics approach that of a CW laser with the same reliability issues associated with doubling a CW laser source. These types of lasers cannot provide the high power and CW output and beam quality of embodiments of the present inventions.

Prior to the present inventions, laser beams in the 450 nm or less were typically obtained by parametric oscillators, four wave mixing, and frequency tripling of an IR source. These are all inefficient processes that rely on the use of a non-linear crystal to achieve the short (200 nm-450 nm) wavelength. These crystals are incapable of managing the heat loads that occur when laser power approaches a few 100 W (0.1 kW) CW, let alone a kW and greater powers.

Prior to the present inventions, laser beams in the 700 nm-800 nm range were typically obtained by pumping a dye laser, parametric oscillators, four wave mixing, and frequency doubling of an IR source. These are all inefficient processes, the dye lasers tend to bleach out in time and have a limited interaction volume making it difficult to achieve high CW power levels. The other processes rely on the use of a non-linear crystal to achieve the 700 nm-800 nm wavelength. These crystals are incapable of managing the heat loads that occur when laser power approaches a few 100 W (0.1 kW) CW, let alone a kW and greater powers.

As used herein, unless expressly provided otherwise, the terms "display", "laser projection", "projection", "illumination" and similar such terms are to be given their broadest possible meanings and would include outdoor cinema, outdoor displays such as at a stadium, theater, concert venue, indoor cinema, IMAX cinema and any other large screen format. The implementation of a high brightness laser source for the display application would allow viewing of a laser projected image in bright sunlight such as is encountered in a stadium. The high brightness laser projector would also be suitable for displays in convention centers where the indoor illumination has always been a challenge for low output projections to provide clear crisp displays.

As used herein, unless expressly stated otherwise, the terms "high power", "high power laser", and "high power laser beam", and similar terms refer to powers of 0.5 kW to 5 kW, 1 kW to 10 kW, 0.5 kW to 10 kW, 1 kW, 2 kW, 5 kW, from about 1 kW to about 10 kW, from about 2 kW to 6 kW, and all powers within these ranges, as well as, greater powers.

As used herein, unless expressly stated otherwise, the terms "blue laser beams", "blue lasers" and "blue" should be given their broadest meaning, and in general refer to systems that provide laser beams, laser beams, laser sources, e.g., lasers and diodes lasers, that provide, e.g., propagate, a laser beam, or light having a wavelength from 400 nm (nanometer) to 500 nm, and from about 400 nm to about 500 nm. Typical blue lasers have wavelengths in the range of about 405-495 nm. Blue lasers include wavelengths of 450 nm, of about 450 nm, of 460 nm, of about 470 nm. Blue lasers can have bandwidths of from about 10 pm (picometer) to about 10 nm, about 5 nm, about 10 nm and about 20 nm, as well as greater and smaller values.

As used herein, unless expressly stated otherwise, "UV", ultraviolet", "UV spectrum", and "UV portion of the spectrum" and similar terms, should be given their broadest meaning, and would include light in the wavelengths of from about 10 nm to about 400 nm, and from 10 nm to 400 nm.

As used herein, unless expressly stated otherwise, the terms "visible", "visible spectrum", and "visible portion of the spectrum" and similar terms should be given their broadest meaning, and would include light in the wavelengths from about 380 nm to about 750 nm, and from 400 nm to 700 nm.

As used herein, unless expressly stated otherwise, the terms "green laser beams", "green lasers" and "green" should be given their broadest meaning and in general refer to systems that provide laser beams, laser beams, laser sources, e.g., lasers and diode lasers, that provide, e.g. propagate, a laser beam or light having a wavelength range from 500 nm to 700 nm, about 500 nm to about 575 nm. Green lasers include wavelengths of 515 nm, of about 515 nm, of 532 nm, about 532 nm, of 550 nm, and of about 550 nm. Green lasers can have bandwidths of from about 10 pm to 10 nm, about 5 nm, about 10 nm and about 20 nm, as well as greater and smaller values.

As used herein, unless stated otherwise, room temperature is 25° C. And, standard temperature and pressure is 25° C. and 1 atmosphere. Unless expressly stated otherwise all tests, test results, physical properties, and values that are temperature dependent, pressure dependent, or both, are provided at standard temperature and pressure.

Generally, the term "about" and the symbol "~" as used herein, unless specified otherwise, is meant to encompass a variance or range of ±10%, the experimental or instrument error associated with obtaining the stated value, and preferably the larger of these.

As used herein, unless specified otherwise, the recitation of ranges of values, a range, from about "x" to about "y", and similar such terms and quantifications, serve as merely shorthand methods of referring individually to separate values within the range. Thus, they include each item, feature, value, amount or quantity falling within that range. As used herein, unless specified otherwise, each and all individual points within a range are incorporated into this specification, and are a part of this specification, as if they were individually recited herein.

This Background of the Invention section is intended to introduce various aspects of the art, which may be associated with embodiments of the present inventions. Thus, the forgoing discussion in this section provides a framework for better understanding the present inventions, and is not to be viewed as an admission of prior art.

SUMMARY

There has been a long-standing and unfulfilled need for, among other things, lasers to provide laser beams in the 300 nm-800 nm wavelengths, and in particular visible lasers and white light lasers for bright illumination applications as well as material processing applications. The present inventions, among other things, solve these needs by providing the articles of manufacture, devices and processes taught, and disclosed herein.

There is provided a laser projection display, having three primary wavelengths to produce high quality white light as perceived by the eye. The primary wavelengths change between the viewing conditions, in the dark, the eye response is Scotopic where the vision acuity shifts to the blue portion of the visible spectrum and in bright light the eye response is Photopic where the vision acuity shifts to the red portion of the visible spectrum.

There is provided a laser illumination and projection system, and methods, having the system tuned to Scotopic acuity, Photopic acuity, and a combined system have systems tuned to both acuities, thereby providing a unique visual experience when viewing either in bright illumination or a dark room. This system having a short wavelength laser diode to directly pump a Raman fiber laser directly that then lases on any combination of Raman orders as required to align the visible output spectrum with the desired spectrum.

There is provided a laser illumination and projection system, and methods, having a short wavelength laser diode to pump a high power, high brightness Raman fiber laser that then pumps a second Raman fiber laser designed to lase on the multiple wavelength desired.

There is provided these laser systems and methods of displaying and illumination having one or more of the following features: wherein the short wavelength laser diode has a wavelength that is shorter than the desired output wavelengths to pump a high power, high brightness Raman oscillator, or a Raman fiber laser; wherein the multiple wavelength output may be a continuous series of Raman orders oscillating or several orders are oscillated internally to the oscillator or fiber and only the Raman orders desired can exit the laser; wherein the display and illumination wavelengths are 450 nm, 520 nm and 650 nm; wherein the display and illumination wavelengths are about 450 nm, about 520 nm and about 650 nm; wherein the display and illumination wavelengths are each a primary color; wherein the display and illumination wavelengths are each a primary color and have a bandwidth of less than 20 μm, less than 15 μm, less than 10 μm, less than 5 μm and less than 2 μm; wherein the display and illumination is automatically adjusted in response to the display luminous intensity and the surrounding illumination to maintain the ideal color perception by the audience; wherein the three primary colors may be provided by a single laser system using the Raman orders shown in Table 1; wherein the system has all Raman orders as an output; wherein the method produces the simultaneous oscillations as listed in Table 1.

There is provided these laser systems and methods of displaying and illumination having one or more of the following features: one or more of the fiber dopants shown in Table 1; a Raman oscillator based on diamond, or a fused silica fiber based system having 14 Stokes shifts to address all the preferred colors for a white light display; a diamond Raman oscillator or a fused silica fiber based system having 5 Stokes shifts to address all the preferred colors for a white light display; a diamond Raman oscillator or a fused silica fiber based system having from 4 to 16 Stokes shifts to address all the preferred colors for a white light display; a phosphorous doped system having 5 Stokes shifts.

There is provided a method and system utilizing this method having a Raman active material to create a white light display or multi-wavelength laser source from a blue diode laser source or blue diode pumped Raman laser source.

There is provided these laser systems and methods of displaying an illumination having a high-power blue laser diode source free spaced coupled to a Raman diamond oscillator, or Raman oscillator fiber; wherein the Raman oscillator fiber has an outer clad that has a numerical aperture of 0.22, preferably 0.5 or even 0.55 that matches the brightness of the blue laser pump energy; whereby the Raman gain occurs in the central core which is a step index or preferably a graded index core, on the order of 4 microns, 6 microns, 10 microns or more which results in the preferred oscillation of the LP01 mode (single mode) when used with a fiber Bragg grating that preferentially reflects the LP01 mode; the Raman shifted power from the first Raman oscillator is oscillated in the second Raman oscillator resulting in a third Raman shifted output; the third Raman shifted output power is than oscillated in the fourth Raman oscillator to generate a fourth Raman shifted output; there by each of these oscillators are within the same section of fiber with the greater wavelength oscillator fiber Bragg gratings being outside of the lower wavelength oscillators.

There is provided these laser systems and methods of displaying and illumination having a diode pumped nested Raman oscillator.

There is provided these laser systems and methods of displaying and illumination having one or more of the following features: the output of the nested Raman oscillator with only a single wavelength output by the oscillator at a predetermined number of Raman shifts; the output of the nested Raman oscillator with multiple wavelength set to 470 nm, 534 nm, and 660 nm; the output of the nested Raman oscillator matches the requirements for a high power display operating in a bright illumination environment; a single Raman shift oscillators; a nested Raman shift oscillators; a Raman oscillator shifting from 450 nm to 459 nm; a Raman oscillator shifting from 459 nm to 549 nm; wherein there are a plurality of resonators and each resonator adds power to the output beam at each specific wavelength at the output end of the fiber; wherein the amount of power in each wavelength can be tailored by adjusting the Q of one, more than one, and all cavities; wherein the amount of power in each wavelength can be tailored by adjusting fiber length of one, more than one, and all cavities; wherein the amount of power in each wavelength can be tailored by adjusting the Q of a cavity and the fiber length of a cavity.

There is provided a laser systems and methods of displaying and illumination having a high-power blue laser diode source free space coupled to a Raman oscillator fiber which then sequentially pumps multiple Raman oscillators at different Raman shifts, wherein the Raman oscillator fiber consists of an outer clad that has a numerical aperture of 0.22, preferably 0.5, or even 0.55 that matches the brightness of the blue laser pump energy; wherein the Raman gain occurs in the central core which is a step index or preferably a graded index core, on the order of 4 microns, 6 microns, 10 microns or more in diameter which results in the preferred oscillation of the LP01 mode; whereby the Raman output of the first oscillator, pumps a second oscillator, since the second oscillator is pumped directly in the core, a much shorter fiber can be used than the cladding pumped first oscillator.

There is provided these laser systems and methods of displaying and illumination having one or more of the following features: wherein the output of the first Raman shift generator is used to seed a second Raman shift generator; wherein the output of the second Raman shift generator is recombined with the portion of the unsampled first Raman generator though a dichroic mirror to produce a beam with two wavelengths; wherein the output of the third, fourth or more Raman shift generators are recombined with the portion of the unsampled first Raman generator though a dichroic mirror to produce a beam with two wavelengths.

There is provided a laser systems and methods of displaying and illumination having a high brightness 450 nm laser diode module pumping a Raman oscillator that is then spontaneously converted to a different wavelength along the long length of a fiber; a CW laser, having a length of the fiber to exactly determine the number of Raman shifts, whereby the output of the fiber has equal power levels in the original wavelength and in the shifted wavelength.

There is provided a laser system and method of displaying and illumination having a CW laser, There is provided commercially viable or useful lasers in the 300-700 nm range operating at either a single wavelength or multiple wavelengths, having high powers, e.g., 1 kW and greater, and having high beam quality, e.g., $M^2 \sim 1$.

There is provided a laser system and method of displaying and illumination having several blue laser diode pumped Raman oscillators as a pump to a secondary Raman oscillator, wherein the first Raman oscillator acts as a brightness convertor, which changes the highly multi-mode laser diode output to a single mode, or low order multi-mode source.

There is provided a laser system and method of displaying and illumination having the Q of each resonator tuned to achieve the desired wavelength shift or sequence of wavelengths.

There is provided a laser system and method of displaying and illumination having a series of high power blue laser diodes pump a series of Raman lasers that are then used to pump another Raman laser that converts the outputs of the multiple lasers into a single mode output; wherein the wavelength is shifted in a series of short cavities in a sequence.

There is provided a laser system and method of displaying and illumination having: a multi-wavelength visible fiber laser source; pumped by high power blue laser diodes; nested Raman oscillators to create multiple wavelength outputs; and fiber Bragg Gratings provide the mode filter element in the fiber laser.

There is provided these laser systems and methods of displaying and illuminating having one or more of the following features: wherein the high-power blue laser diodes are launched into the clad of the Raman oscillator; wherein the high-power blue laser diodes are spectrally beam combined and launched into the clad of the Raman oscillator; having a high numerical aperture clad surrounding a step index single mode core with the core to clad ratio ranging from 1:2, 1:4, 1:6, 1:10 or higher; having a high numerical aperture clad surrounding a graded index core with a core to clad ratio ranging from 1:2, 1:4, 1:6, 1:10 or higher; having a Fiber Bragg Grating written directly in the step index core; having a Fiber Bragg Grating written directly in the graded index core; having external optics that form a resonator; having a sequence of Fiber Bragg Gratings that define a single shifted output wavelength; having a sequence of Fiber Bragg Gratings that defines multiple cavities which results in multiple output wavelengths; having a high numerical aperture clad surrounding a step index multimode core; and having a high numerical aperture clad surrounding a graded index multimode core.

There is provided these laser systems and methods of illuminating and displaying having a multi-wavelength visible fiber laser source; a pumped by high power blue laser diodes; a sequential Raman oscillators to create multiple wavelength outputs; a fiber Bragg Gratings provide the mode filter element in the fiber laser, There is provided these laser systems and methods of displaying and illuminating having one or more of the following features: wherein the high-power blue laser diodes are launched into the clad of the Raman oscillator; wherein the high-power blue laser diodes are spectrally beam combined and launched into the clad of the Raman oscillator; having a high numerical aperture clad surrounding a step index single mode core with the core to clad ratio ranging from 1:2, 1:4, 1:6, 1:10 or higher; having a high numerical aperture clad surrounding a graded index core with a core to clad ratio ranging from 1:2, 1:4, 1:6, 1:10 or higher; having a Fiber Bragg Grating written directly in the step index core; having a Fiber Bragg Grating written directly in the graded index core; having external optics that form a resonator; having a sequence of Fiber Bragg Gratings that define a single shifted output wavelength; having a sequence of Fiber Bragg Gratings that defines multiple cavities which results in multiple output wavelengths; having a high numerical aperture clad surrounding a step index multimode core; having a high numerical aperture clad surrounding a graded index multimode core.

There is provided these laser systems and methods of illuminating and displaying having: a multi-wavelength visible fiber laser source, a pumped by high power blue laser diodes; a single Raman oscillator to launch high power in the central core; a spontaneous Raman generator to create multiple wavelength outputs There is provided these laser systems and methods of illuminating and displaying having: a multi-wavelength visible fiber laser source; a pumped by multiple Raman oscillators pumped by blue laser diodes; a nested Raman oscillators to create multiple wavelength outputs; a fiber Bragg Gratings provide the mode filter element in the fiber laser.

There is provided these laser systems and methods of displaying and illuminating having one or more of the following features: having a sequence of Fiber Bragg Gratings that defines multiple cavities which results in multiple output wavelengths; having a high numerical aperture clad surrounding a step index multimode core; having a high numerical aperture clad surrounding a graded index multimode core.

There is provided these laser systems and methods of displaying and illuminating having: a multi-wavelength visible fiber laser source; a pumped by multiple Raman oscillators pumped by blue laser diodes; a sequential Raman oscillators to create multiple wavelength outputs; a fiber Bragg Gratings to provide the mode filter element in the fiber laser, There is provided these laser systems and methods of displaying and illumination having one or more of the following features: wherein the high-power blue laser diodes are launched into the clad of the Raman oscillator; wherein the high-power blue laser diodes are spectrally beam combined and launched into the clad of the Raman oscillator; having a high numerical aperture clad surrounding a step index single mode core with the core to clad ratio ranging from 1:2, 1:4, 1:6, 1:10 or higher; having a high numerical aperture clad surrounding a graded index core with a core to clad ratio ranging from 1:2, 1:4, 1:6, 1:10 or higher; having a Fiber Bragg Grating written directly in the step index core; having a Fiber Bragg Grating written directly in the graded index core; having external optics that form a resonator; having a sequence of Fiber Bragg Gratings that define a single shifted output wavelength; having a sequence of Fiber Bragg Gratings that defines multiple cavities which results in multiple output wavelengths; having a high numerical aperture clad surrounding a step index multimode core; having a high numerical aperture clad surrounding a graded index multimode core; having multiple output wavelengths that create three ideal wavelengths for viewing a projection display in dim background illumination; having multiple output wavelengths that create three ideal wavelengths for viewing a projection display in a bright background illumination.

There is provided these laser systems and methods of displaying and illumination having one or more of the following features: wherein the high-power blue laser diodes are launched into a Fabry Perot resonator with a Raman active material such as diamond to create the Raman shifts. The resonator or resonators may be nested or sequential to generate the next Raman order or n Raman orders depending on the output wavelength desired. The Raman cavities can be tuned to provide the three ideal wavelengths for viewing under all lighting conditions.

Further, there is provided a projection system, configured to projection an image on a large surface for viewing by an audience, the system having: a laser source configured to provide an initial laser beam having a wavelength of less than 500 nm; the laser source in optical communication with a multicolor fiber laser source; and, the multi-color fiber laser source configured to provide laser beams having a plurality of wavelengths within the multi-color laser source; and configured to transmit an output projection laser beam, wherein the output projection beam laser has three primary color laser beams; wherein a first primary color laser beam is red; wherein a second primary color laser beam is blue; wherein a third primary color laser beam is green.

Still further there are provided these systems and methods having on or more of the following features: wherein in the multi-color fiber laser source is selected from the group consisting of a nested Raman oscillator, sequential Raman oscillator, a ring resonator configuration and a free space Raman device; wherein the multi-color fiber laser source has a Raman active material and the Raman active material contains a material selected from the group consisting of silica, $GeO_2$, phoshorus, diamond, $Ba(NO_3)_2$ KGW $YVO_4$ and $Ba(NO_3)_2$; wherein the multi-color fiber laser source has a Raman active material and the Raman active material contains a material selected from the group consisting of silica, $GeO_2$, phoshorus, diamond, $Ba(NO_3)_2$ KGW $YVO_4$ and $Ba(NO_3)_2$; wherein the system is configured to provide the first primary color laser beam by a Raman frequency shift/material selected from the group consisting of $5^{th}$ Stokes/Diamond, $6^{th}$ Stokes/$Ba(NO_3)_2$, $7^{th}$ Stokes/KGW, $YVO_4$, and $14^{th}$ Stokes/Silica; wherein the system is configured to provide the first primary color laser beam by a Raman frequency shift/material selected from the group consisting of $5^{th}$ Stokes/Diamond, $6^{th}$ Stokes/$Ba(NO_3)_2$, $7^{th}$ Stokes/KGW, $YVO_4$, and $14^{th}$ Stokes/Silica; wherein the system is configured to provide the second primary color laser beam by a Raman frequency shift/material selected from the group consisting of $1^{st}$ Stokes/Silica Blue, $1^{st}$ Stokes/Phosphrus, $1^{st}$ Stokes/Diamond, $1^{st}$ Stokes/KGW Blue, $1^{st}$ Stokes/$YVO_4$, and $1^{st}$ Stokes/$Ba(NO_3)_2$; wherein the system is configured to provide the third primary color laser beam by a Raman frequency shift/material selected from the group consisting of $3^{rd}$ Stokes/Diamond, $3^{rd}$ Stokes/$Ba(NO_3)_2$, $4^{th}$ Stokes/KGW, $4^{th}$ Stokes/$YVO_4$; $3^{rd}$ Stokes/Phosphorus, $5^{th}$ Stokes/Phophorus Green 6.42E-05, $7^{th}$ Stokes/Silica; wherein the laser source has a blue laser diode pump, and wherein the blue laser diode pump is colinear with an oscillating mode of the multi-color fiber laser source; wherein the laser source has a plurality of blue laser diode pumps, and wherein the plurality of blue laser diode pumps is colinear with an oscillating mode of the multi-color fiber laser source; wherein the laser source has a blue laser diode pump, and wherein the blue laser diode pump is transverse with an oscillating mode of the multi-color fiber laser source; wherein the laser source has a plurality of blue laser diode pumps, and wherein the plurality of blue laser diode pumps is transverse with an oscillating mode of the multi-color fiber laser source; wherein the laser source has a blue laser diode pump, and wherein the blue laser diode pump is both transverse and colinear with an oscillating mode of the multi-color fiber laser source; wherein the laser source has a plurality of blue laser diode pump, and wherein the plurality of blue laser diode pumps is both transverse and colinear with an oscillating mode of the multi-color fiber laser source; wherein the laser source has a blue laser diode pump, and wherein the blue laser diode pump is colinear and forward pumping with an oscillating mode of the multi-color fiber laser source; wherein the laser source has a plurality of blue laser diode pump, and wherein the plurality of blue laser diode pumps is colinear and forward pumping with an oscillating mode of the multi-color fiber laser source; wherein the laser source has a blue laser diode pump, and wherein the blue laser diode pump is colinear and backward pumping with an oscillating mode of the multi-color fiber laser source; wherein the laser source has a plurality of blue laser diode pump, and wherein the plurality of blue laser diode pumps is colinear and backward pumping with an oscillating mode of the multi-color fiber laser source; wherein the laser source has a blue laser diode pump, and wherein the blue laser diode pump is simultaneously pumping forward and backward with an oscillating mode of the multi-color fiber laser source; wherein the laser source has a plurality of blue laser diode pump, and wherein the plurality of blue laser diode pumps is simultaneously pumping forward and backward with an oscillating mode of the multi-color fiber laser source; wherein the laser source has a blue laser diode pump, and wherein at least one of the primary color laser beams is provided by optical filters; wherein at least one of the primary color laser beams is provided by an optical filter; wherein the laser source has a blue laser diode pump, and having a dichroic filter, whereby the three primary color laser beams are combined to provide the output projection laser beam; wherein at least one of the primary color laser beams is provided by an optical filter; wherein the laser source has a blue laser diode pump, and having a dichroic filter, whereby the three primary color laser beams are combined to provide the output projection laser beam; wherein the multi-color fiber laser source has a Raman active medium; wherein one, two, or three of the wavelengths of the three primary color laser beams are selected to be optimum for Photopic visual sensitivity; wherein one, two, or three of the wavelengths of the three primary color laser beams are selected to be optimum for Scotopic visual sensitivity; wherein the system is adjustable to provide one, two, or three of the wavelengths of the three primary color laser beams selected to be optimum for Scotopic or Photopic visual sensitivity; and wherein the multi-color fiber laser source is adjustable to provide one, two, or three of the wavelengths of the three primary color laser beams selected to be optimum for Scotopic or Photopic visual sensitivity.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 17 is a Table I, of Raman frequency Shifts for Common Fibers.

FIG. 18 is Table II, of Raman frequency shifts for several common Raman Materials.

DESCRIPTION OF THE PREFERRED EMBODIMENTS

The present inventions relate to lasers that produce multi-wavelength laser beams in the wavelength range of 300 nm to 700 nm, including high power beams in these wavelengths having excellent beam qualities. This method can be applied to a wide range of manufacturing and display systems, allowing the high-power white light to be generated directly from a single fiber laser source.

Embodiments of these high power systems, having 300 nm to 700 nm wavelength ranges can find application in manufacturing, controlling work flow of units in a transportation systems, such as rail, air, navel, warning systems, entertainment, sporting events, art, public art, crowd art, public art displays, pop-up art, drive-in movies, theater, concert venues, movie theaters, home theaters, home entertainment, outdoor venues, as well as other applications where images, objects and both need to be illumination, projected or displayed.

Figure 1:
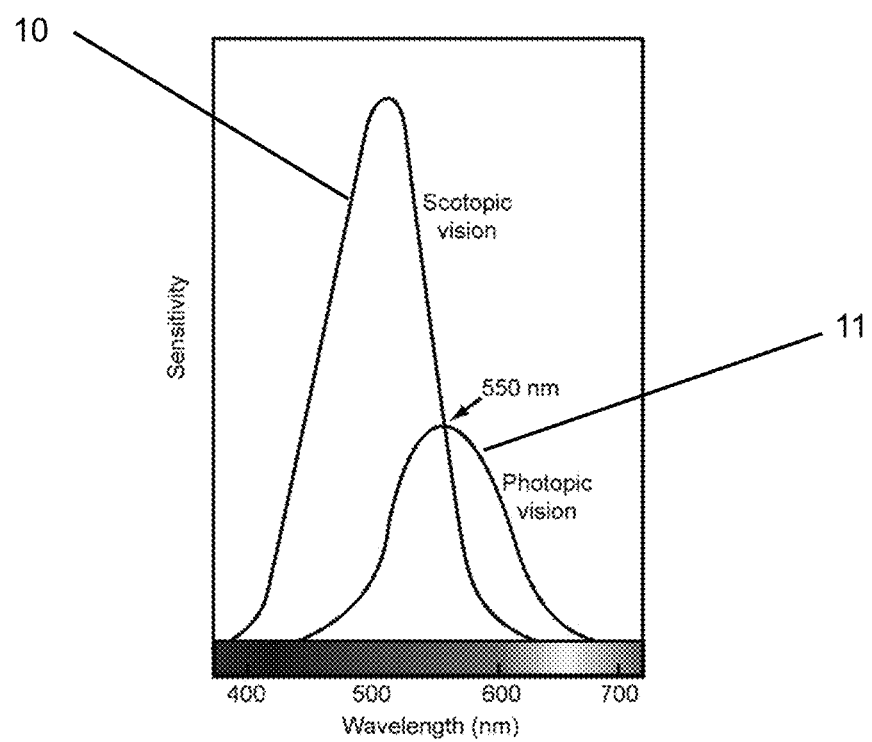
FIG. 1 is a graph illustrating the shift in vision sensitivity depending on the illumination environment, which embodiments of the present inventions address and optimize.
Figure 2:
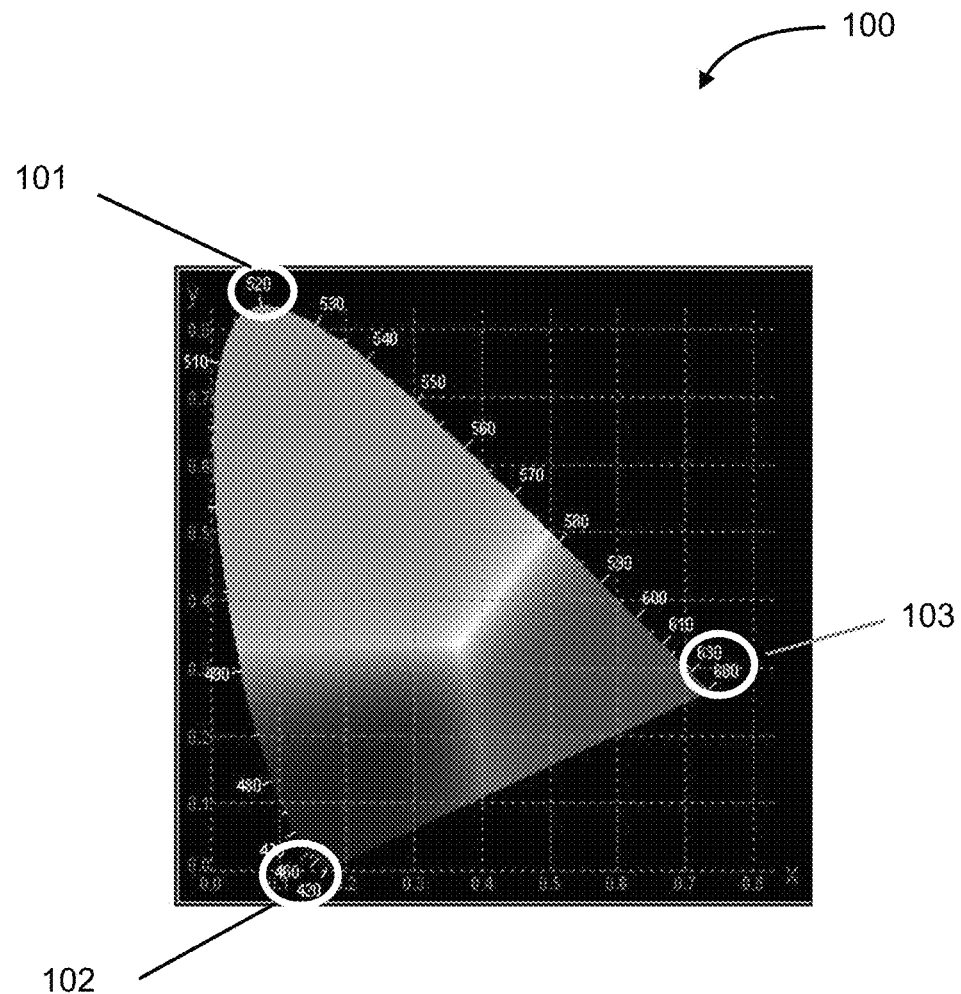
FIG. 2. is a graph illustrating the ideal laser wavelengths required to achieve the full range of colors whether viewing in a dim illumination environment (e.g., cinema) or a high illumination environment (e.g., stadiums) in accordance with the present inventions.

Embodiments of these inventions use the non-linear phenomenon of Stimulated Raman Scattering (SRS) to increase the brightness of a multi-mode blue laser diode source and to create a multi-wavelength output beam, to shift the output wavelength of this source, or in multicomponent systems both. FIG. 2. Shows the ideal laser wavelengths required to achieve the full range of colors whether viewing in a dim illumination environment (cinema) or a high illumination environment (stadiums). A preferred embodiment of a cinema projection uses the present laser systems to provide a laser projection beam that would have three primary colors centered on the peaks, 101 (about 520 nm), 102 (about 460-420 nm), 103 (about 630-680) of chart 100 as shown in FIG. 2 with a near single mode beam for scanning a large screen. The exact wavelengths chosen will be based on the illumination environment as shown in FIG. 1 where the vision acuity varies depending on the lighting conditions. FIG. 1 shows the shift in vision sensitivity depending on the illumination environment. Thus, the vision sensitivity for Scotopic vision is shown by peak 10, and vision sensitivity for Photopic vision is shown by peak 11. Thus, it can be seen that peak vision sensitivity shifts from a dim illumination environment, where Scotopic vision predominates and peak sensitivity is 510 nm, to a peak sensitivity of 550 nm for a bright, i.e., high illumination, environment, where Photopic vision predominates.

In this manner in an embodiment of the present systems the wavelength peaks for each of the three primary colors in the projection beam are matched to, or optimized to, the viewing environment. Thus, in embodiments the peaks for each of the three primary colors in the projection beam shifted can have their wavelength shifted, their intensity increased, or both, to compensate for the loss of, or change in, visual sensitivity for certain wavelength depending upon the illumination environment. Thus, in an embodiment the intensity of the wavelength peaks for each of the three primary colors in the projection beam can be optimized for Photopic vision sensitivity of graph 11. In an embodiment the intensity of the wavelength peaks for each of the three primary colors in the projection beam can be optimized for Scotopic vision sensitivity of graph 10.

Figure 3:
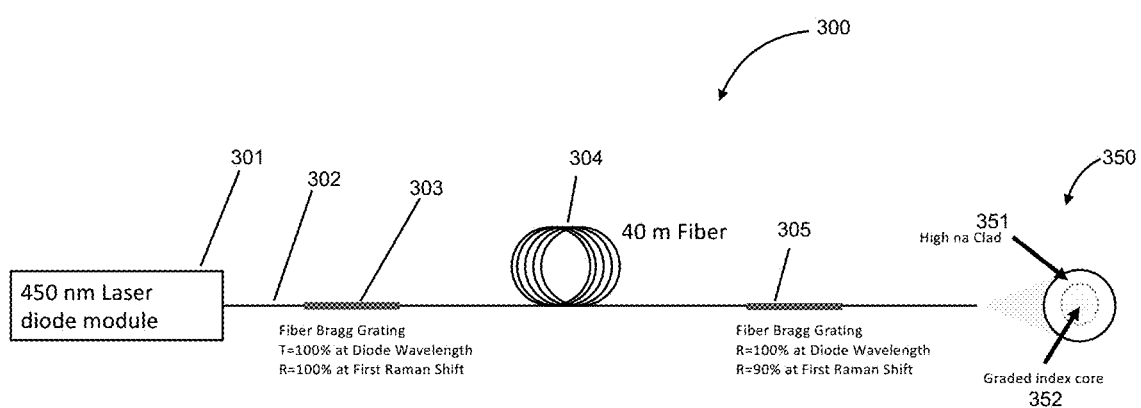
FIG. 3 is a schematic of an embodiment of a high power blue laser system in accordance with the present inventions.

In the embodiment of FIG. 3, a high power blue laser diode module is used to pump a Raman fiber oscillator based on a phosphorous doped core and Fiber Bragg Gratings written directly into the phosphorous doped core that preferentially reflect the LP01 mode thus acting as a mode filter for the oscillator.

Figure 4:
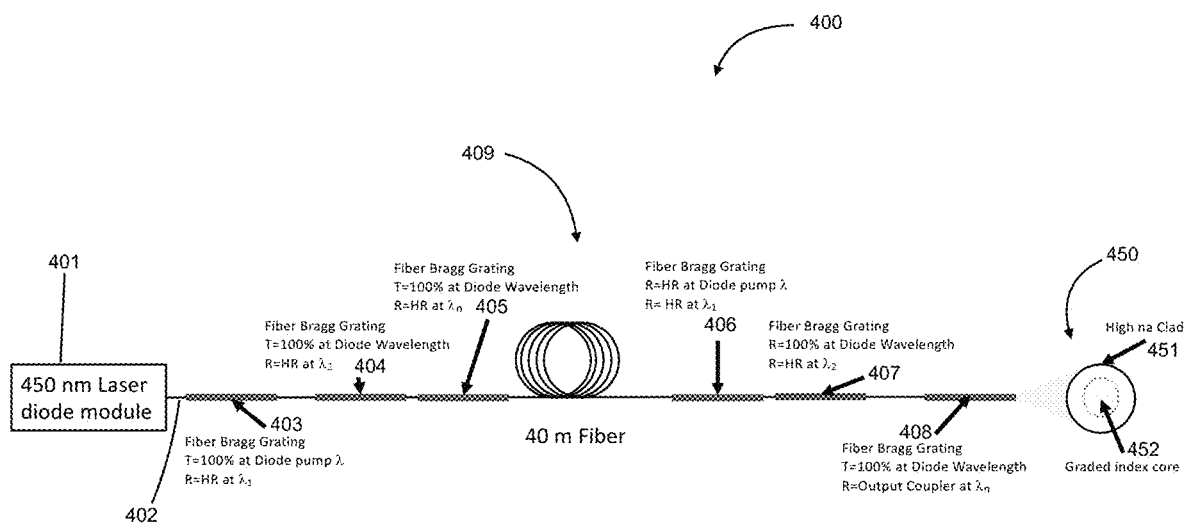
FIG. 4 is a schematic of an embodiment of a high power blue laser system in accordance with the present inventions.

In the embodiment of FIG. 4, a nested or cascaded Raman oscillator is directly pumped by a module(s) of high power blue laser diodes fiber coupled into a passive fiber with the same step index core characteristics as the pump clad of the nested Raman oscillator fiber.

Figure 5:
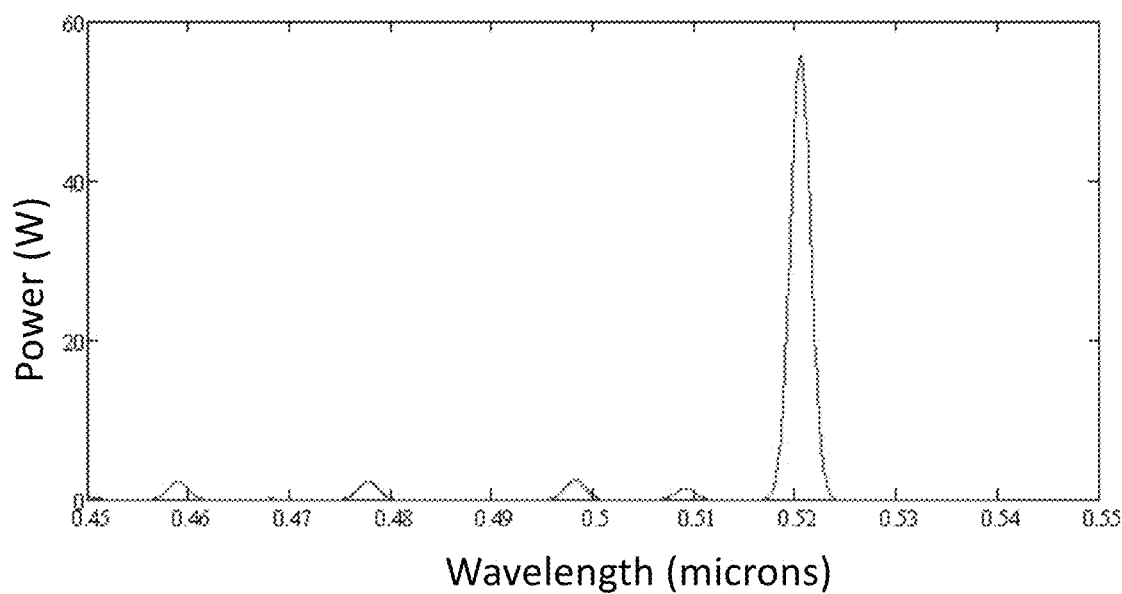
FIG. 5 is a graph illustrating the shifting of the output of an embodiment of a primary Raman oscillator by 7 stokes shifts in accordance with the present inventions.

FIG. 5 is a graph illustrating laser output wavelength for a simulation of an embodiment of the shifting of the output of the primary Raman oscillator by 7 stokes shifts and optimized to output a single primary wavelength. Other wavelengths are present due to the imperfection of the Fiber Bragg Gratings, and can, in an embodiment, be rejected by a notch filter at the exit of the optical fiber.

Figure 6:
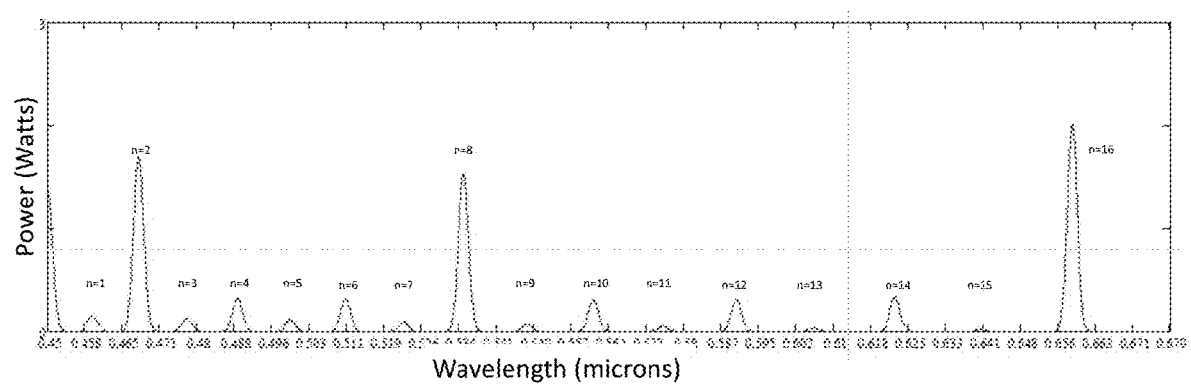
FIG. 6 is a graph illustrating the simultaneous wavelength outputs from an embodiment of a nested Raman oscillator for a total of 10 stokes shifts in accordance with the present inventions.

FIG. 6 is a graph illustrating laser output wavelength for a simulation of an embodiment where simultaneous wavelength outputs from a nested Raman oscillator for a total of 10 stokes shifts. Here all the intermediate resonators have the same reflectivities resulting in a uniform power distribution among the various wavelengths. This embodiment provides multi-wavelength output aligned with display requirements from a nested Raman oscillator pumped by blue laser diodes. Each oscillator is HR:HR with the exception of the second stokes shift, eight stokes shift and the sixteenth stokes shift, which are all set to 95%.

Figure 7:
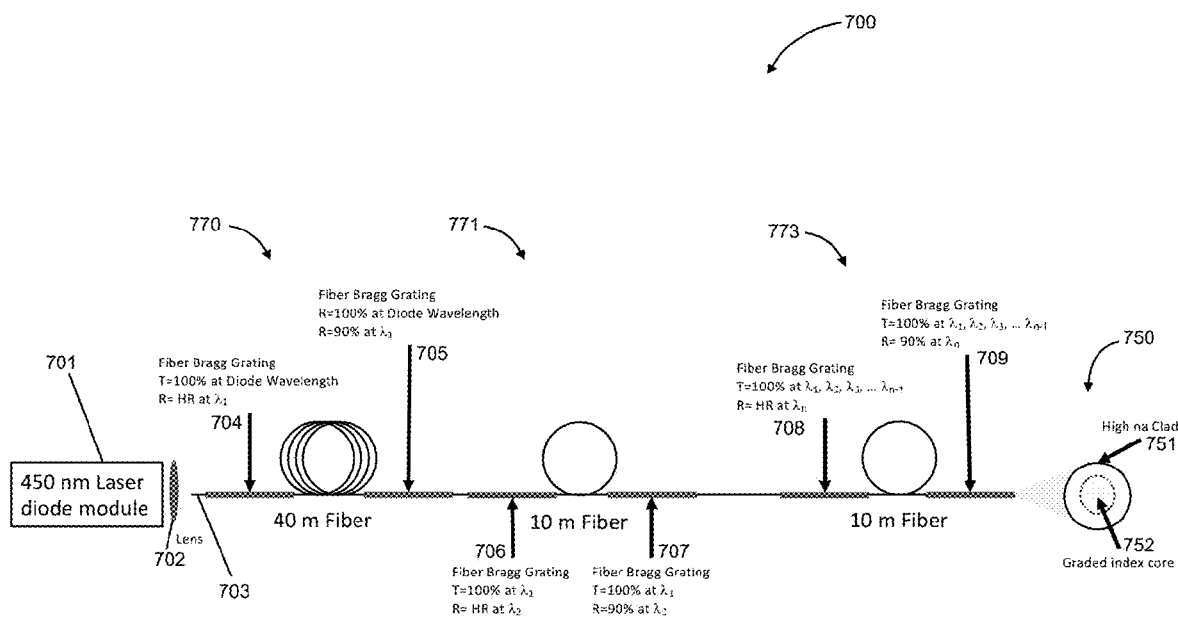
FIG. 7 is a schematic of an embodiment of a high power blue laser diode module being free space coupled into the primary Raman oscillator in accordance with the present inventions.

In the embodiment of FIG. 7, a high power blue laser diode module is free space coupled into the primary Raman oscillator to convert the multi-mode blue power launched into the clad into a single mode or series of modes confined to the core followed by a sequential conversion of the wavelengths of the various resonators to produce a group of wavelengths from a single laser source. Thus, there is a high power blue laser diode pumped Raman oscillator followed by n Raman oscillators for generation of additional wavelengths.

Figure 8:
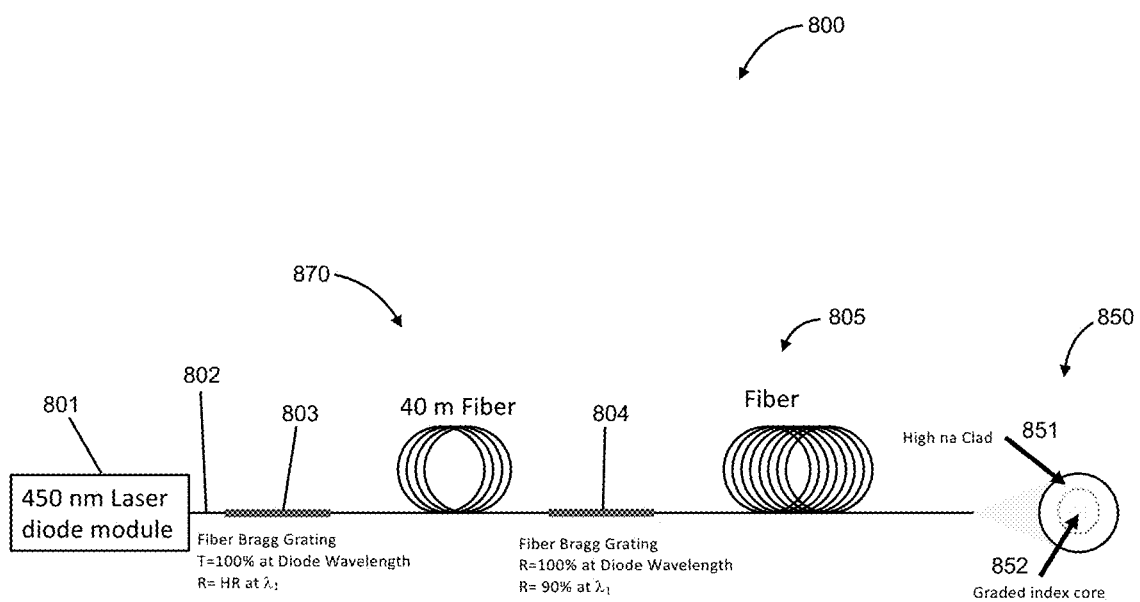
FIG. 8 is a schematic of an embodiment of a high power blue laser diode module being coupled into a primary Raman oscillator in accordance with the present inventions.

In the embodiment of FIG. 8, a high power blue laser diode module is coupled into a primary Raman oscillator to convert the multi-mode blue power launched into the clad of the fiber into a single mode or series of modes confined to the core followed by a spontaneous Raman convertor fiber. Thus, there is a diode pumped Raman fiber oscillator pumping a spontaneous Raman generation fiber.

Figure 9:
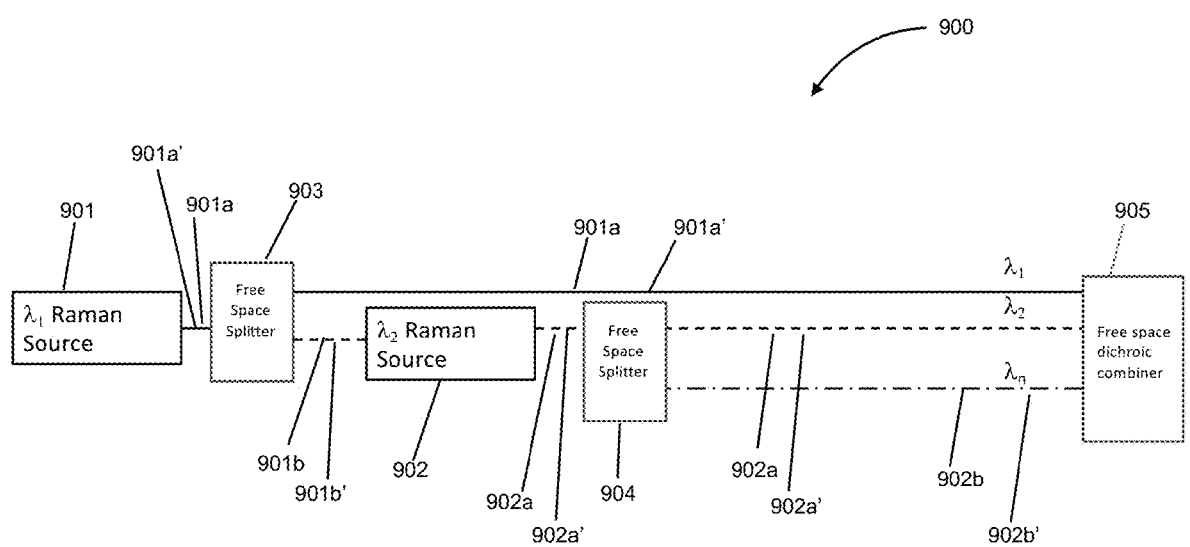
FIG. 9 is a schematic of an embodiment of a free space method to generate n-Raman wavelengths and recombine them into a single beam in accordance with the present inventions.

In the embodiment of FIG. 9, there is shown a free space method to generate n-Raman wavelengths and recombine them into a single beam, referred to herein as a free space Raman device.

In the embodiment of FIG. 9, there is shown a method using free space to separate all of the Raman convertors and decouple their behaviors and to recombine them using a dichroic combiner which could be a filter, transmission grating or reflective grating.

Figure 10:
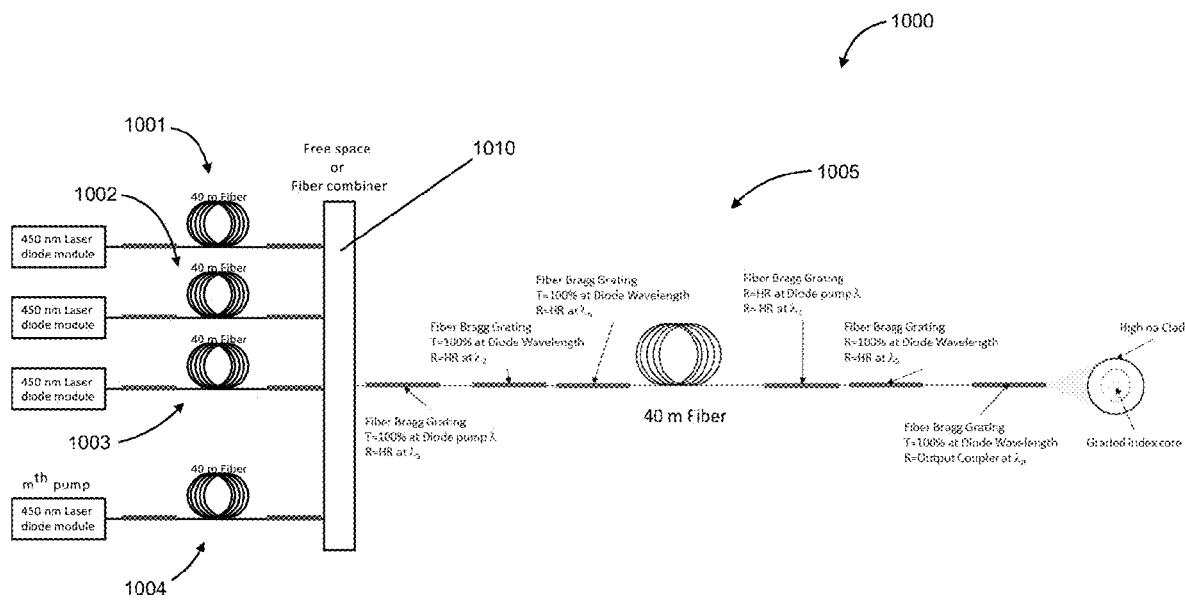
FIG. 10 is a schematic of an embodiment of a system having a group of high power blue laser sources spatially combined into nested RAMAN oscillators in accordance with the present inventions.

In the embodiment of FIG. 10, a group of high-power blue laser sources are spatially combined and launched into the cladding of the nested RAMAN oscillators which converts the highly multi-mode beams in the cladding into a single mode, or near single mode beam because of the Fiber Bragg Gratings which act as mode filters in the fiber cavities. Thus, there is a blue laser pumped Raman oscillators used to pump a multi-wavelength nested Raman convertor In the embodiment of FIG. 11, a group of high-power blue laser sources are spatially combined and launched into the cladding of the sequential RAMAN oscillators which converts the highly multi-mode beams in the cladding into a single mode, or near single mode beam because of the Fiber Bragg Gratings which act as mode filters in the fiber cavities. Thus, there is a blue laser diode pumped Raman oscillators pumping sequential Raman cascade of lasers.

Turning in more depth to the embodiment of FIG. 3, there is shown a schematic of a laser system 300. The system 300 has a high power blue laser diode module 301, which optically connected to a fiber 302 having a first fiber Bragg grating 303, a Raman fiber oscillator 304 and a second fiber Bragg grating 305. In a preferred embodiment the first fiber Bragg grating 303 has 100% transmittance at the wave length of the laser diode and 100% reflectance at the wavelength of the first Raman shift. The second fiber Bragg grating 305 has a 100% reflectance at the laser diode wavelength and a 90% reflectance at the first Raman shift wavelength. A cross section of the fiber 350 shows that it has a graded index core 352 and a high na cladding 351.

In an embodiment the blue laser diode has a wave length of from 400 nm to 495 nm, about 450 nm, and about 460 nm. In an embodiment the laser diode may also be a green laser diode and produce, or propagate, a green laser beam, e.g., 500 nm to 700 nm, about 515 nm, and about 530 nm. In an embodiment the Raman fiber oscillator 304 is based on a phosphorous doped core.

The system shown in FIG. 3 is a preferred embodiment for converting the relatively low beam quality blue laser diode module power to a high beam quality, single mode or nearly single mode beam. In general this technique and system uses three components to produce this high-quality output beam, e.g., $M^2=\sim1$, $M^2<1.05$, $M^2<1.1$, $M^2<1.25$, $M^2<1.5$. This beam quality is present for all axes of the output beam, including, where present, the slow and the fast axis of the final output beam. In general, the three components for the embodiment of FIG. 3 are: 1) a high-power multi-mode blue laser diode module (>50 W) with sufficient beam quality (>20 mm-mrad) to launch into the Raman oscillator clad; 2) an optical fiber with two guiding layers, an outer pump clad that is 20 µm, 50 µm, 100 µm or more, with a numerical aperture of 0.2, 0.3 or 0.55 or higher and an inner graded index core that is 2 µm, 4 µm, 10 µm or even 20 µm with a numerical aperture of 0.04, 0.08, 0.1 or higher; and, 3) Fiber Bragg Gratings (FBG) that provide feedback at discrete wavelengths such as each of the Stokes shifts from the pump wavelength to longer, and to discrete laser modes such as the LP01 over all other laser modes. It being understood that other components may be utilized or incorporated in various systems and embodiments of the system of FIG. 3. Additionally, instead of FBG, external mirrors can be used, ring resonator designs may be incorporated and superradiance, where no cavity is required, but the length of the fiber determines the output wavelength.

The high-power multi-mode blue laser diode can be a fiber coupled module and the output fiber can be fused directly to the Raman oscillator fiber (e.g., the embodiment of FIG. 3) or it can be free space coupled from the blue laser diode module directly to the Raman oscillator (e.g., the embodiment of FIG. 7). The cladding can be of any design ranging from a circular cross section to an asymmetric circular or rectangle cross section, the goal being to maximize the number of interactions between the modes of the cladding region and the core region. The preferred embodiment is a design which eliminates whisper modes that never cross the core region. As the blue pump light crosses through the core region, it undergoes spontaneous Raman scattering, as well as excitation of the virtual Raman states. The fiber core captures some of this spontaneous radiation and propagates it along the axis of the fiber core. Two FBGs are provided, one at the rear of the fiber if the pump light is propagating in a forward direction toward the output coupler, that is Highly Reflective (HR) at the first stokes shift, and a second at the exit end of the fiber which has a reflectivity that is lower than HR but sufficiently high that the round trip gain exceeds the round trip losses. When this condition is met, the system lases and the power that is incident on the output coupler FBG exits the fiber. Since the FBGs preferentially reflect the LP01 mode, this output beam will consist mainly of the LP01 mode with the mode quality being dictated by any micro-bends, core heating or other fiber imperfections that can disrupt achieving an $M^2=\sim1$ output beam. The pumping of the RAMAN oscillator can be performed in a forward direction (toward the output coupler), a backward direction (toward the HR reflector) or it can be double passed through the fiber to achieve higher conversion efficiencies. This configuration of a Raman oscillator can shift the wavelength of the pump source, one Stokes (or anti-Stokes) shift according to Tables 1 & 2.

Turning to FIG. 4 there is shown a schematic of a multi-color laser system 400. The system 400 has a laser diode 401 in optical communication with a fiber 402, having FBGs 403, 404, 405, 406, 407, 408, which form Raman oscillator 409. The cross section 450 of fiber 402 is also shown, having a high na clad 451 and a graded index core 452. A much larger wavelength shift can be achieved with the embodiment shown in FIG. 4. A set of FBGs are position on the fiber such that the first Stokes shift cavity (formed between FBG 403 and FBG 408) coincides with the second Stokes shift cavity (formed between FBG 404 and FBG 407). This configuration takes advantage of the high circulating intensity in the first Stokes shift cavity to interact with the second Stokes shift cavity, resulting in oscillation on the second Stokes wavelength. If all the back FBG's are HR and all the front FBGs are HR except for the last output coupler then the output of the nested or cascade Raman oscillators is a single wavelength shifted by n-Stokes order as shown in FIG. 5. If all the back FBG's are HR and all the front FBG's have some lower finite reflectivity, and the last FBG has the lowest reflectivity then it is possible to generate a series of output wavelengths from the system as shown in FIG. 6. If all the back FBG's are HR and all the output couplers are HR except for the three wavelengths that are desired for a display, i.e., 459 nm, 520 nm and 634 nm, then the laser output consists of the three primary RGB colors necessary for a brilliant display.

Turning to FIG. 7 there is shown a schematic of a multi-color laser system 700. The system 700 has a laser diode 701 in optical communication with lens 702 and the lens is in optical communication with a fiber 703. The laser beam is propagated through free space from the laser to the lens 702. The laser beam is launched into the fiber 703, being propagated through free space by lens 702. The system 700 has three Raman oscillators 770, 771, 773. The fiber 703 has FBGs 704, 705, 706, 707, 708, 709. The cross section 750 of fiber 703 is also shown, having a high na clad 751 and a graded index core 752. In embodiments of this multi-color laser system, the Raman oscillators, 770, 771, 773, can be of the type shown in FIG. 3. In a preferred embodiment of this system, Raman oscillator 770 can be of the type of the embodiment of FIG. 3 and used to convert the blue laser diode module output from the cladding pumped modes to the core modes. The power contained in the core of the fiber is now a very high-power density ranging from a few MW/cm$^2$ to 10's of MW/cm$^2$ or even 100's of MW/cm$^2$, the only requirement is to maintain the power density below the damage threshold of the fused silica which is typically 1 GW/cm$^2$ and it can be shifted by a cascade of Raman oscillators 771, 772, distributed along the length of the fiber 703. Again, the FBGs can be tailored to determine the output wavelength of the system. An advantage of this approach is the heat load on the fiber is distributed over a much longer fiber length. The disadvantage of this approach, compared to other embodiments of the present inventions, for this visible wavelength range is the long optical fibers that must be used to realize this embodiment, which results in high scattering losses. Thus, the power extraction for embodiments of the type shown in FIG. 7 will not be as efficient as the nested Raman oscillator embodiment of the type shown in FIG. 4.

Turning to FIG. 8 there is shown a schematic of a multi-color laser system 800. The system 800 has a blue laser diode 801 in optical communication with a fiber 802, a Raman oscillator 870, FBGs 803, 804, and a long length 805 of fiber 802 after the Raman oscillator 870. The cross section 850 of fiber 802 is also shown, having a high na clad 851 and a graded index core 852. In a preferred embodiment, this systems uses the Raman oscillator of the type of the embodiment of FIG. 3. The Raman oscillator 870 is used to seed a long length 805 of optical fiber to create spontaneous Raman emissions. In this embodiment there are no secondary resonators to control the mode of the propagating beam and as a consequence, the output beam with this approach will have a multi-mode output as well as a spectrally broad output. In addition, the long fiber lengths required to achieve the desired wavelength shifts will make it difficult to achieve high power levels from this approach because of the high scattering losses of these fibers in the visible regime (15-30 dB/km). Thus, this approach is preferred, although not so limited, for dim illumination and Scotopic vision sensitivity.

Turning to FIG. 9, there is shown a multi-color laser system 900 having a Raman oscillator 901, and a second, downstream (or distal) and parallel Raman oscillator 902; and has free space splitters 903, 904, and free space dichroic combiner 905. Raman oscillator 901 propagates laser beam 901a' (e.g., generated by the first Stokes shift) along beam path 901a to splitter 903. At splitter 903, laser beam 901a, continues along laser beam path 901a' to free space dichroic combiner 905; and laser beam 901b' is transited along laser beam path 901b to Raman oscillator 902, which, laser beam 902a', e.g., by the second Stokes shift. Laser beam 902a' has a different wavelength than laser beam 901a'. Laser beam 902a' is propagated along laser beam path 902a to free space splitter 904. At splitter 904 laser beam 902a' is transmitted along laser beam path 902 to the dichroic combiner 905; and laser beam 902b' is split out, having a different wavelength from beam 902a', and is transmitted along beam path 902b to dichroic combiner. Dichroic combiner, combines and transmits beams 901a', 902a' and 902b' as a multi-color output beam. In this embodiment spontaneous Raman signals are generated in a parallel fashion. In this embodiment, a sequential spontaneous Raman approach is not required, resulting in less attenuation of the original laser power. This parallel fashion Raman generation technique can also be applied to any of the other embodiments of systems taught by this specification. The wavelengths of laser beams 901a', 902a' and 902b' are optimization, based upon visual sensitivity (graph of FIG. 1) and the chart of FIG. 2, to provide the optimum wavelengths for a predetermined viewing environment, e.g., high illumination or dim illumination.

Turning to FIG. 10 there is shown an embodiment of a multicolor laser system 1000. The system 1000, has four Raman oscillators 1001, 1002, 1003, 1004, that are combined and used to seed a multi-color subsystem 1005. The beams from the four Raman oscillators can be combined, for example, in free space or by a fiber combiner (shown as box 1010). In this embodiment of the multi-color visible laser system 1000 one or more, and all, of the Raman oscillators can be the Raman oscillators of the embodiment of FIG. 3. In this embodiment the multi-color system 1005 can be a nested multi-color system, and preferably the system of the embodiment of FIG. 4. It being understood that more or less Raman oscillators may be used, and that other multi-color subsystems may be utilized.

Figure 11:
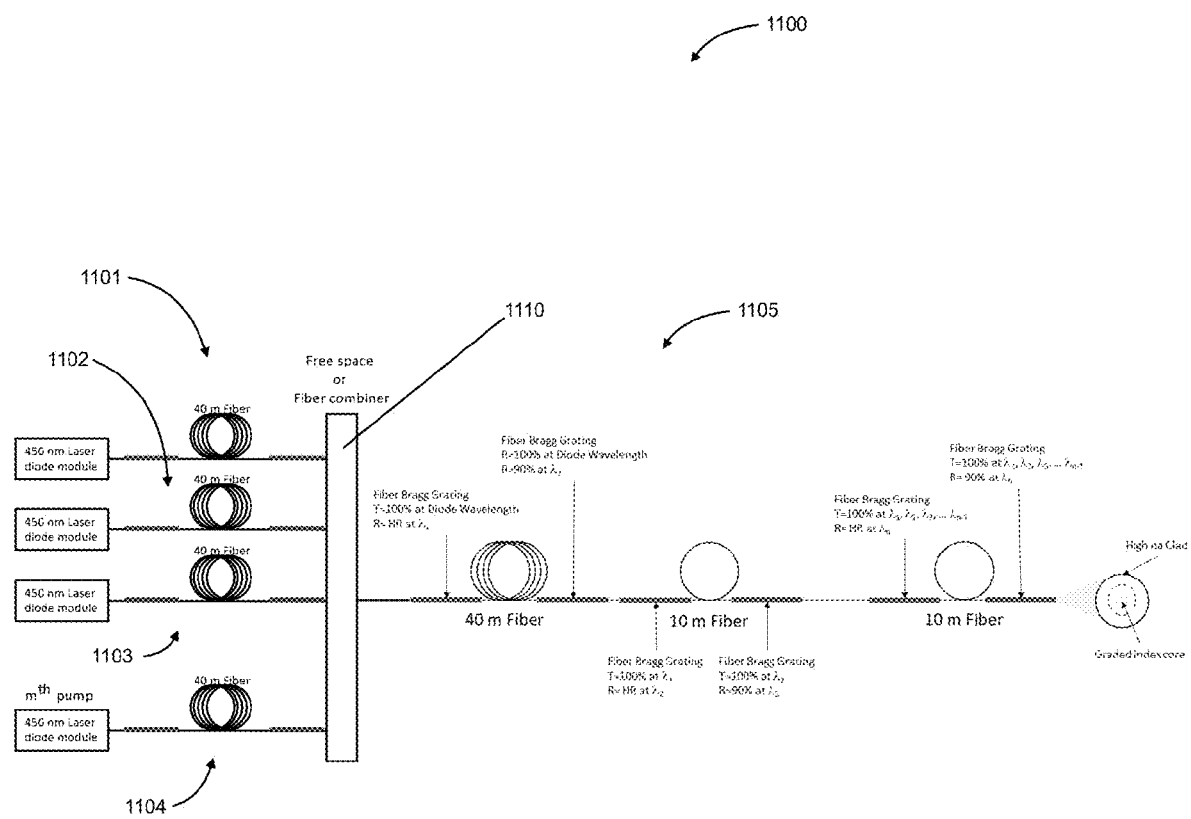
FIG. 11 is a schematic of an embodiment of a system having a group of high power blue laser sources spatially combined sequential RAMAN oscillators in accordance with the present inventions.

Turning to FIG. 11 there is shown an embodiment of a multicolor laser system 1100. The system 1100, has four Raman oscillators 1101, 1102, 1103, 1104, that are combined and used to seed a multi-color subsystem 1105. The beams from the four Raman oscillators can be combined, for example, in free space or by a fiber combiner (shown as box 1110). In this embodiment of the multi-color visible laser system 1100 one or more, and all, of the Raman oscillators can be the Raman oscillators of the embodiment of FIG. 3. In this embodiment the multi-color system 1105 can be a serial multi-color system, and preferably the system of the embodiment of FIG. 7.

Figure 12:
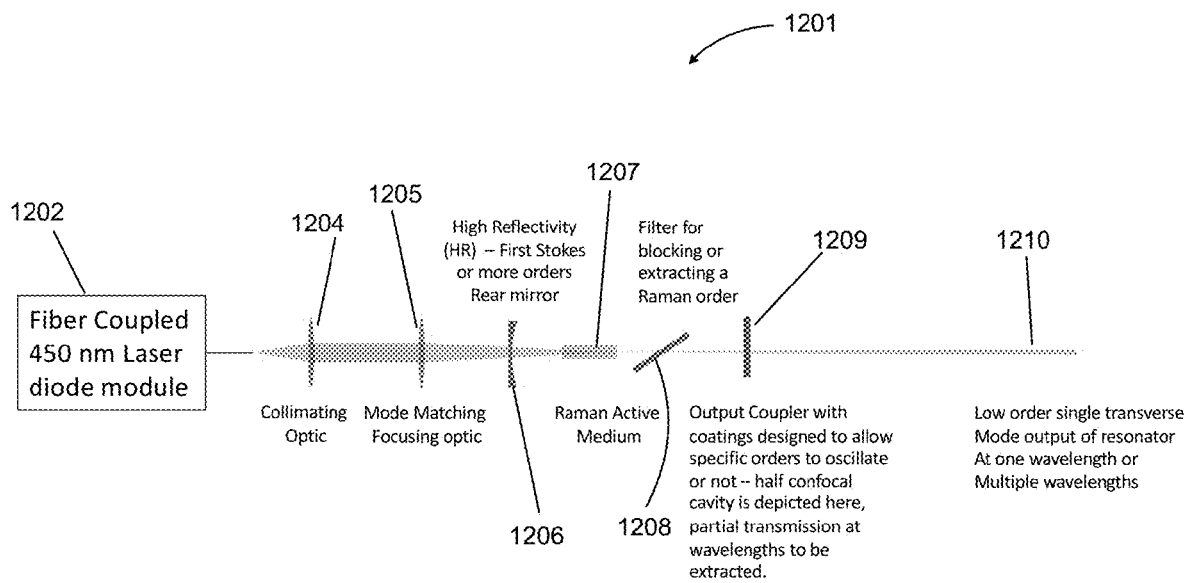
FIG. 12 is s schematic of an embodiment of a system having a longitudinally pumped Raman oscillator to select a single transverse mode or low order transverse mode in accordance with the present inventions.

Turning to FIG. 12, there is shown a schematic of an embodiment of a multicolor laser system 1201. The system 1201 is an embodiment of a longitudinally pumped Raman Oscillator using a half confocal cavity to select a single transverse mode or low order transverse mode. The system 1201 has a fiber coupled 450 nm laser diode module 1202 that provides a laser beam and that is in optical communication, as shown in the figure, with a collimating optic 1204, a mode matching focusing optic 1205, a high reflectivity (HR) first Stokes or more orders rear mirror 1206, a Raman active medium 1207, a filter for blocking or extracting a Raman order 1208, and an output coupler 1209 (with coatings designed to allow specific orders to oscillate or not—a half confocal cavity is depicted in the figure, which partially transmits at the wavelengths to be extracted). A low order single transverse mode out laser beam 1210 is provided, which can be at one wavelength and preferably is at multiple wavelengths and more preferably having the three primary colors.

Figure 13:
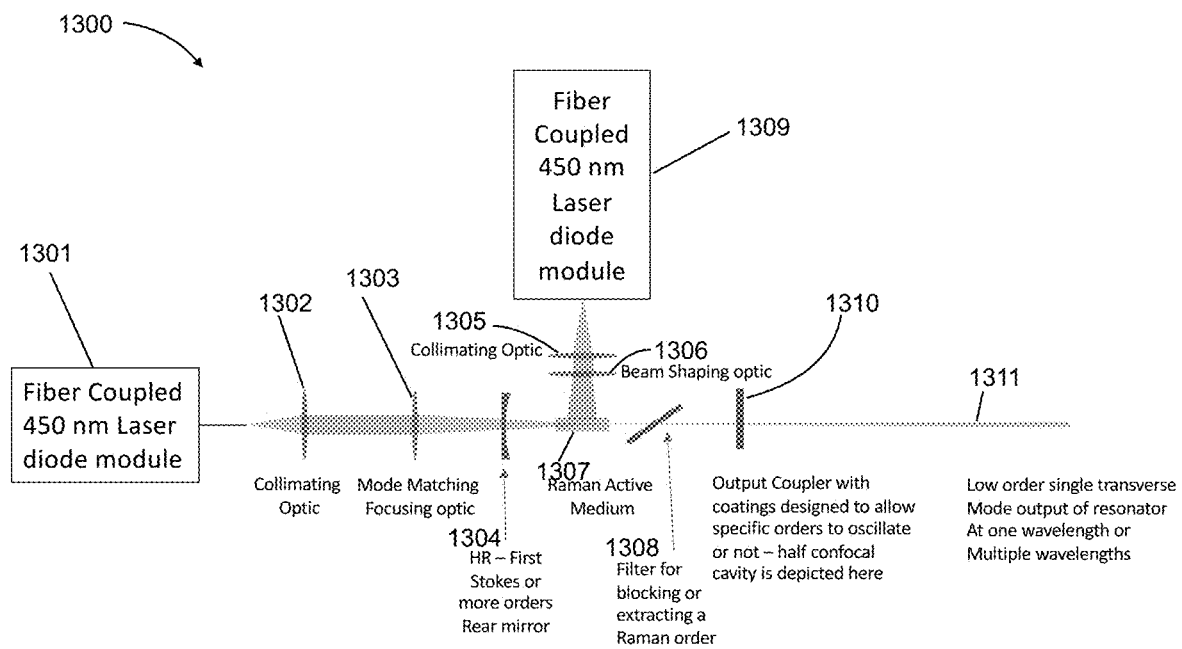
FIG. 13 is a schematic of an embodiment of a system having a Raman oscillator longitudinally pumped in forward direction combined with transverse pumping. in accordance with the present inventions.

Turning to FIG. 13, there is shown a schematic of an embodiment of a multicolor laser system 1300. The system 1300 is an embodiment of a Raman oscillator longitudinally pumped in forward direction combined with transverse pumping. The system 1300 has a fiber coupled 450 nm laser diode module 1301 that provides a laser beam and that is in optical communication, as shown in the figure, with a collimating optic 1302, a mode matching focusing optic 1303, a high reflectivity (HR) first Stokes or more orders rear mirror 1304, a Raman active medium 1307, a filter for blocking or extracting a Raman order 1308, and an output coupler 1310 (with coatings designed to allow specific orders to oscillate or not—a half confocal cavity is depicted in the figure, which partially transmits at the wavelengths to be extracted). The system 1301 has a second fiber coupled 450 nm laser diode module 1309 that provides a laser beam and that is optical communication, as shown in the figures, with a collimating optic 1305 and a beam shaping optic 130, which in turn provides a transverse laser beam to the Raman active medium 1307. A low order single transverse mode output laser beam 1311 is provided by the system 1300, which can be at one wavelength and preferably is at multiple wavelengths and more preferably having the three primary colors.

Figure 14:
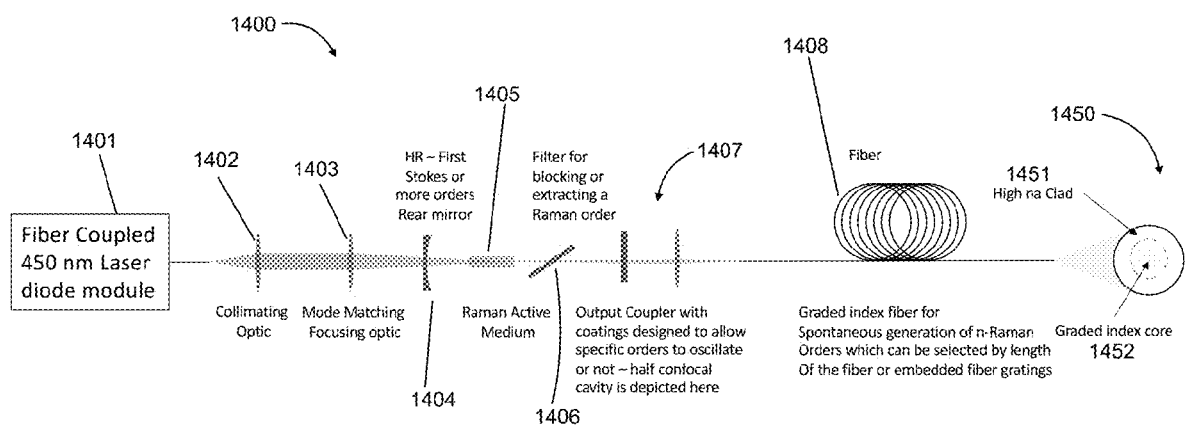
FIG. 14 is a schematic of an embodiment of a system having a diode pumped Raman oscillator pumping a spontaneous Raman generation fiber in accordance with the present inventions.

Turning to FIG. 14, there is shown a schematic of an embodiment of a multicolor laser system 1400. The system 1400 is an embodiment of a diode pumped Raman oscillator pumping a spontaneous Raman generation fiber. The system 1400 has a fiber coupled 450 nm laser diode module 1401 that provides a laser beam and that is in optical communication, as shown in the figure, with a collimating optic 1402, a mode matching focusing optic 1403, a high reflectivity (HR) first Stokes or more orders rear mirror 1404, a Raman active medium 1405, a filter for blocking or extracting a Raman order 1406, and an output coupler 1407 (with coatings designed to allow specific orders to oscillate or not—a half confocal cavity is depicted in the figure, which partially transmits at the wavelengths to be extracted), which focusses the laser beam into a fiber 1408. The fiber 1408 is a graded index fiber for spontaneous generation of n-Raman orders, which can be selected by the length of the fiber or by embedded gratings. A cross section 1450 of fiber 1408 is shown, the fiber 1408 having a high na cladding 1451 and a graded index core 1452. The system 1400 provides a laser beam at one wavelength and preferably at multiple wavelengths and more preferably having the three primary colors.

Figure 15:
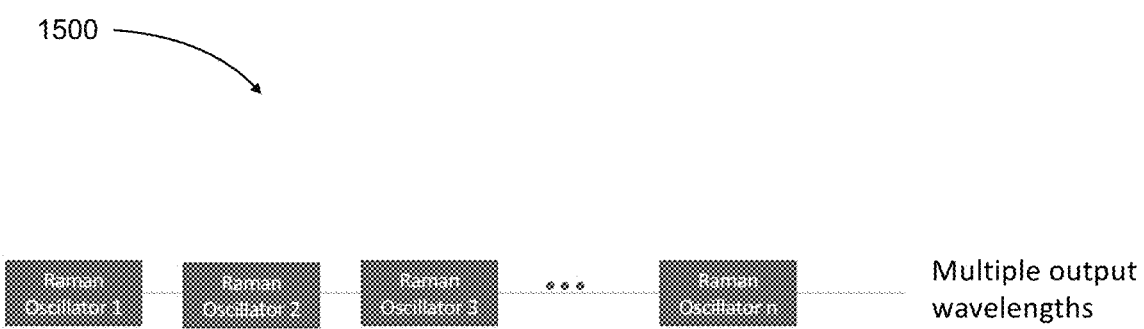
FIG. 15 is a schematic of an embodiment of a system having a blue laser diode pumped Raman oscillators pumping sequential Raman cascade of lasers in accordance with the present inventions.

Turning to FIG. 15, there is shown a schematic of an embodiment of a multicolor laser system 1500. The system 1500 is a blue laser diode pumped Raman oscillators pumping sequential Raman cascade of lasers Raman oscillator 1 is pumped by a by a blue laser diode module (not shown in the figure), Raman oscillator 1 then generates a laser beam that pumps Raman oscillator 2, which in turn pumps Raman oscillator 3, etc. to the $n^{th}$ number of Raman oscillators. In this manner a multiple output wavelengths laser beam is provided, preferably having the three primary colors.

Figure 16:
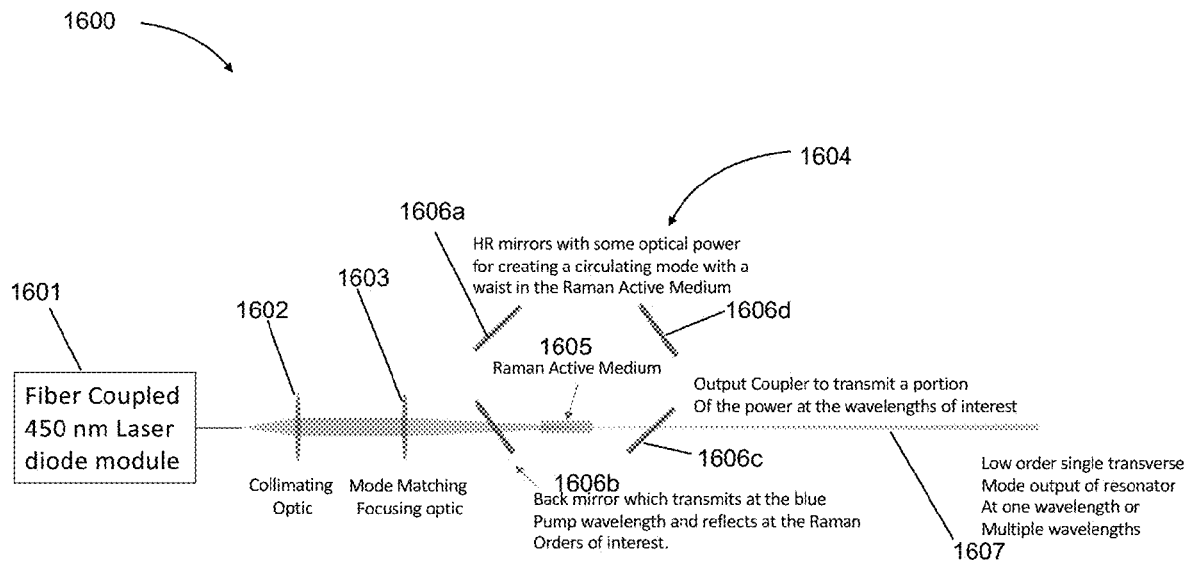
FIG. 16 is a schematic of an embodiment of a system having a ring resonator Raman laser in accordance with the present inventions.

Turning to FIG. 16, there is shown a schematic of an embodiment of a multicolor laser system 1600. The system 1601 is an embodiment of a ring resonator configuration for a Raman laser. The system 1600 has a fiber coupled 450 nm laser diode module 1601 that provides a laser beam and that is in optical communication, as shown in the figure, with a collimating optic 1602, a mode matching focusing optic 1603, ring mirror assembly 1604. The ring assembly 1604 that has HR mirrors with some optical power for creating a circulating mode with a waist in the Raman active medium 1605. The assembly 1604 has a mirror 1606a, a back mirror 1606b (which transmits at the blue pump wavelength and reflects at the Raman orders that have been predetermined or are of interest) an output coupler 1606c and a mirror 1606d. The system 1601 provides a low order single transverse mode output laser beam 1607 having one wavelength and preferably multiple wavelengths and more preferably having the three primary colors.

A difference between the approach shown in FIG. 10 from the approach shown in FIG. 4 is that the higher brightness Raman oscillator outputs are now used to pump the clad of the nested (FIG. 10) or sequential (FIG. 11) to achieve a much higher conversion efficiency from the pump energy to the output wavelengths. This approach allows the outer clad of the fiber to be, 20 µm, 25 µm, or 30 µm compared to the core which is 4 µm, 6 µm or 10 µm. When the clad is 20 µm and the core is 10 µm, the overlap between the modes in the clad and the core is very high resulting in a very efficient energy transfer from the clad to the core where the conversion efficiency can range from 50% to over 80% of the power in the mode being converted.

Generally, for the embodiments that are not spontaneous Raman embodiments, the Q of each resonator is preferably tuned to achieve the desired wavelength shift or sequence of wavelengths. In the nested resonator case, each of the resonators are strongly coupled, by choosing all of the intermediate Raman shift cavities to have a high Q, the output is then the last resonator which is chosen to have a high output coupling to suppress the generation of the next Raman order. When the Q of the cavities are all reduced as seen in FIG. 6, the output power from each Raman order is high for the odd orders and low for the even orders. This is because the resonators are all identical in this case and the odd orders are stealing power from the even orders. This occurs for both cases, however in this case, the output couplers are at 98% reflectivity, so the power from each of the oscillators escapes the end of the fiber.

The following examples are provided to illustrate various embodiments of laser arrays, systems, apparatus and methods of the present inventions. These examples are for illustrative purposes, may be prophetic, and should not be viewed as, and do not otherwise limit the scope of the present inventions.

EXAMPLE 1

There is provided an embodiment of a laser projection display, requiring three primary wavelengths to produce high quality white light as perceived by the eye. The primary wavelengths change between the viewing conditions, in the dark, the eye response is Scotopic where the vision acuity shifts to the blue portion of the visible spectrum and in bright light the eye response is Photopic where the vision acuity shifts to the red portion of the visible spectrum. (FIG. 1) This embodiment can be tuned to either vision acuity providing a unique visual experience when viewing either in bright illumination or a dark room. This system would use a short wavelength laser diode, typically shorter than the desired output wavelengths, to directly pump a Raman fiber laser directly that then lases on any combination of Raman orders as required to align the visible output spectrum with the desired spectrum. This embodiment can also use a short wavelength laser diode, typically shorter than the desired output wavelengths to pump a high power, high brightness Raman fiber laser that then pumps a second Raman fiber laser designed to lase on the multiple wavelength desired. The multiple wavelength output may be a continuous series of Raman orders oscillating or several orders are oscillated internally to the fiber and only the Raman orders desired can exit the laser. FIG. 2 shows the Chromaticity chart for full color displays and identifies the ideal wavelengths for such a display: 450 nm, 520 nm and 650 nm. These wavelengths are generally recognized by designers of laser projection displays as the ideal wavelengths for a display. By providing these three primary wavelengths, it is possible to adjust the display in response to the display luminous intensity and the surrounding illumination to maintain the ideal color perception by the audience. The three primary colors may be provided by a single laser system using the Raman orders shown in Table 1, or the system may be designed to provide all Raman orders as an output. This method may be used to produce the simultaneous oscillations as listed in Table I (below and as FIG. 17) for three common optical fibers and their dopants, the wavelengths ideal for a white light display are highlighted (and which are: $1^{st}$ Stokes/Silica Blue—4.59E-05, $1^{st}$ Stokes/Phosphrus Blue 4.79E-05; $3^{rd}$ Stokes/Phosphorus Green 5.48E-05; $5^{th}$ Stokes/Phophorus Green 6.42E-05, $7^{th}$ Stokes/Silica Green 5.22E-05; $14^{th}$ Stokes/Silica Red 6.23E-05)

EXAMPLE 2

Embodiments of these lasers and systems may use any material as a pant in the fiber, the three most common dopants and their related Stokes shifts are shown in Table 1. A system based on a fused silica fiber requires as many as 14 Stokes shifts to address all the preferred colors for a white light display. The Germanium shows the same wavelength shift spectrum similarly showing the large number of shifts required to achieve three primary colors. Given the high losses in the optical fiber at these wavelengths, the greater the number of shifts required to achieve the desired output the lower the efficiency of the system because of the many round trips in the system. The phosphorous doped fiber however has one of the largest Raman shifts available and therefore, only 5 Stokes shifts are required to address all three primary wavelengths for a high brightness, high power laser projection display and is the preferred embodiment.

EXAMPLE 3

Embodiments of these lasers and laser systems can use a wide range of Raman active materials, Table II (below and as FIG. 18) summarizes these materials and how they too can be used to create a white light display or multi-wavelength laser source from a blue diode laser source or blue diode pumped Raman laser source. With the wavelengths ideal for a white light display highlighted (and which are: $1^{st}$ Stokes/Diamond Blue 4.79E-05, $1^{st}$ Stokes/KGW Blue 4.69E-05, $1^{st}$ Stokes/YVO$_4$ Blue 4.69E-05, $1^{st}$ Stokes/Ba(NO$_3$)$_2$ Blue 4.72E-05; $3^{rd}$ Stokes/Diamond Green 5.49E-05, $3^{rd}$ Stokes/Ba(NO$_3$)$_2$ Green 5.24E-05, $4^{th}$ Stokes/KGW Green 5.37E-05, $4^{th}$ Stokes/YVO$_4$ Green 5.36E-05; $5^{th}$ Stokes/Diamond Red 6.43E-05, $6^{th}$ Stokes/Ba(NO$_3$)$_2$ Red 6.27E-05, $7^{th}$ Stokes/KGW Red 6.28E-05, $7^{th}$ Stokes/YVO$_4$ Red 6.26E-05).

EXAMPLE 4

Turning to FIG. 3, there is shown a diagram of an embodiment of a high-power blue laser diode source free space coupled to a Raman oscillator fiber. The Raman oscillator fiber consists of an outer clad that has a numerical aperture of 0.22, preferably 0.5 or even 0.55 that matches the brightness of the blue laser pump energy. The Raman gain occurs in the central core which is a step index or preferably a graded index core, on the order of 4 microns, 6 microns, 10 microns or more which results in the preferred oscillation of the LP01 mode (single mode) when used with a fiber Bragg grating that preferentially reflects the LP01 mode. The Raman shifted power from the first Raman oscillator is then oscillated in the second Raman oscillator resulting in a third Raman shifted output. The third Raman shifted output power is than oscillated in the fourth Raman oscillator to generate a fourth Raman shifted output. Each of these oscillators are within the same section of fiber with the greater wavelength oscillator fiber Bragg gratings being outside of the lower wavelength oscillators. FIG. 4 shows the embodiment for a diode pumped nested Raman oscillator. FIG. 5 shows the output of the nested Raman oscillator with only a single wavelength output by the oscillator at a predetermined number of Raman shifts. FIG. 6 shows the output of the nested Raman oscillator with multiple wavelength set to 470 nm, 534 nm, and 660 nm which match the requirements for a high power display operating in a bright illumination environment.

EXAMPLE 5

Turning to FIG. 7 there is shown a diagram of an embodiment of a high-power blue laser diode source free space coupled to a Raman oscillator fiber which then sequentially pumps multiple Raman oscillators at different Raman shifts. The Raman oscillator fiber consists of an outer clad that has a numerical aperture of 0.22, preferably 0.5, or even 0.55 that matches the brightness of the blue laser pump energy. The Raman gain occurs in the central core which is a step index or preferably a graded index core, on the order of 4 microns, 6 microns, 10 microns or more in diameter which results in the preferred oscillation of the LP01 mode. The Raman output of the first oscillator, pumps a second oscillator, since the second oscillator is pumped directly in the core, a much shorter fiber can be used than the cladding pumped first oscillator. These may be single Raman shift oscillators, or nested Raman shift oscillators where a greater wavelength shift is needed, for example in shifting from 450 nm to 459 nm, there is a single shift involved, but then the next shift would be from 459 nm to 549 nm which would be a resonator with two nested Raman oscillators. Each resonator adds power to the output beam at each specific wavelength at the output end of the fiber. The amount of power in each wavelength can be tailored by adjusting the Q of each cavity as well as the fiber length of each cavity.

EXAMPLE 6

The embodiment in FIG. 8 is that of a high brightness 450 nm laser diode module pumping a Raman oscillator that is then spontaneously converted to a different wavelength along the long length of a fiber. This approach requires high-power levels in the fiber core to achieve spontaneous generation of the Raman shift, for example, simulations show that the spontaneous conversion of light from one wavelength to another occurs when length of the fiber and the power in the core exceeds a critical value. The critical value depends on the scattering losses in the fiber, the fiber doping and the fiber construction. It is then a matter of choosing the length of the fiber for a given output wavelength or groups of wavelengths. With a CW laser, it is possible to choose the length of the fiber to exactly determine the number of Raman shifts, so the output of the fiber has equal power levels in the original wavelength and in the shifted wavelength. A potential drawback of this method, compared to other embodiments of the present inventions, is that the fibers typically have high losses (>25 dB/km) and the output power is significantly degraded as the beam propagates, thus limiting the number of Raman orders that can be generated. Another such drawback of this approach is since there is no cavity, there is no modal selectivity, so for the spontaneous Raman approach preferably the central core is single mode (LP01) over all wavelengths being generated.

EXAMPLE 7

In an embodiment having a CW laser, it is possible to choose the length of the fiber to exactly determine the number of Raman shifts, so the output of the fiber has equal power levels in the original wavelength and in the shifted wavelengths. This technique can also be used with enough power to generate a series of n Raman shifted outputs. In this embodiment (e.g., FIG. 9), the output of the first Raman shift generator 901 is used to seed a second Raman shift generator. The output of the second Raman shift generator 902 is then recombined with the portion of the unsampled first Raman generator though a dichroic mirror to produce a beam with two wavelengths. This technique can be extended to a third, fourth or more Raman shift generators to produce a beam composed of many wavelengths from each of the Raman shift generators. The advantage of this method is the power lost from the first Raman source is not subject to scattering losses along the length of the fiber since it is separated out in the first power splitter and recombined via free space optics with the other Raman sources. A potential drawback, compared to other embodiments of the present inventions, is the diffraction effects associated with coupling into and out of each of the optical fibers.

EXAMPLE 8

Turing to FIG. 10 an embodiment of a method to achieve the similar results as in Example 8, but now several blue laser diode pumped Raman oscillators are used as a pump to a secondary Raman oscillator. In this case the first Raman oscillator acts as a brightness convertor, which changes the highly multi-mode laser diode output to a single mode, or low order multi-mode source. Multiple sources can have the same wavelength and be spatially combined, or they can have slightly different wavelengths and be spectrally beam combined to produce a sufficiently bright pump beam for the nested Raman oscillator. The high scattering losses in the visible typically 25, 30, 50 or more dB/km have to be overcome by the gain to achieve lasing in this configuration which is why multiple Raman oscillators are used to launch high optical power directly into the core, or to a tightly confined clad. The clad can be 10 microns and the core 4 microns, or the clad can be 20 microns and the core 10 microns as well as several other combinations with the only constraint being the on-axis intensity must be kept high to keep the gain above the losses in the cavity. FIG. 10 illustrates the free space coupling of multiple Raman lasers into the clad of a fiber that that is 10 microns in diameter, a cladding that is 15 microns in diameter, 20 microns in diameters, 30 microns in diameter or larger depending on the power level of the Raman pump lasers available. The clad has a numerical aperture of 0.2, 0.22, 0.5, 0.55 or higher. The central core is a graded index core that is 4 microns in diameter, 6 microns in diameter, 10 microns in diameter or greater depending on what index grading is required to maintain efficient oscillation of the LP01 mode (single mode).

All but the spontaneous Raman case requires that the Q of each resonator be tuned to achieve the desired wavelength shift or sequence of wavelengths. In the nested resonator case, each of the resonators are strongly coupled, by choosing all of the intermediate Raman shift cavities to have a high Q, the output is then the last resonator which is chosen to have a high output coupling to suppress the generation of the next Raman order. When the Q of the cavities are all reduced as seen in FIG. 6, the output power from each Raman order is high for the odd orders and low for the even orders. This is because the resonators are all identical in this case and the odd orders are stealing power from the even orders. This occurs for both cases, however in this case, the output couplers are at 98% reflectivity, so the power from each of the oscillators escapes the end of the fiber.

EXAMPLE 9

In an embodiment, a series of high power blue laser diodes pump a series of Raman lasers that are then used to pump another Raman laser that converts the outputs of the multiple lasers into a single mode output. The single mode output as shown in FIG. 11, is then wavelength shifted in a series of short cavities in a sequence rather than nested.

It is noted that there is no requirement to provide or address the theory underlying the novel and groundbreaking performance or other beneficial features and properties that are the subject of, or associated with, embodiments of the present inventions. Nevertheless, various theories are provided in this specification to further advance the art in this important area, and in particular in the important area of lasers, laser processing and laser applications. These theories put forth in this specification, and unless expressly stated otherwise, in no way limit, restrict or narrow the scope of protection to be afforded the claimed inventions. These theories many not be required or practiced to utilize the present inventions. It is further understood that the present inventions may lead to new, and heretofore unknown theories to explain the operation, function and features of embodiments of the methods, articles, materials, devices and system of the present inventions; and such later developed theories shall not limit the scope of protection afforded the present inventions.

The various embodiments of lasers, diodes, arrays, modules, assemblies, activities and operations set forth in this specification may be used in the above identified fields and in various other fields. Among others, embodiments of the present inventions can be used with the methods, devices and system of Patent Application Publication Nos. WO 2014/179345, 2016/0067780, 2016/0067827, 2016/0322777, 2017/0343729, 2017/0341180, and 2017/0341144 the entire disclosure of each of which are incorporated herein by reference. Additionally, these embodiments, for example, may be used with: existing lasers, additive manufacturing systems, operations and activities as well as other existing equipment; future lasers, additive manufacturing systems operations and activities; and such items that may be modified, in-part, based on the teachings of this specification. Further, the various embodiments set forth in this specification may be used with each other in different and various combinations. Thus, the configurations provided in the various embodiments of this specification may be used with each other. For example, the components of an embodiment having A, A' and B and the components of an embodiment having A", C and D can be used with each other in various combination, e.g., A, C, D, and A. A" C and D, etc., in accordance with the teaching of this Specification. Thus, and the scope of protection afforded the present inventions should not be limited to a particular embodiment, configuration or arrangement that is set forth in a particular embodiment, example, or in an embodiment in a particular Figure.

The invention may be embodied in other forms than those specifically disclosed herein without departing from its spirit or essential characteristics. The described embodiments are to be considered in all respects only as illustrative and not restrictive.

What is claimed:

1. A multi-wavelength visible laser comprising:
   (a) a plurality of pump sources, each comprising a plurality of high power blue laser diodes;
   (b) a plurality of nested Raman oscillators, configured to create multiple wavelength outputs;
   (c) wherein one of the plurality of pump sources is optically associated with one of the plurality of the nested Raman oscillators and thereby pumps the associated nested Raman oscillator; and,
   (d) a fiber laser comprising a plurality of Fiber Bragg Gratings that provide a mode filter element in the fiber laser;
   (e) wherein the fiber laser is in optical communication with the outputs from the nested Raman oscillators.

2. The laser of claim 1, where the high-power blue laser diodes are launched into a clad of each of the Raman oscillators.

3. The laser of claim 1, where each of the high-power blue laser diodes are spectrally beam combined and launched into a clad of each of the Raman oscillator.

4. The laser of claim 1, further comprising a high numerical aperture clad surrounding a step index single mode core; and, having a core to clad ratio ranging from 1:2 to 1:10.

5. The laser of claim 1, further comprising has a high numerical aperture clad surrounding a graded index core; and, having a core to clad ratio ranging from 1:2 to 1:10.

6. The laser of claim 4, wherein at least one of the Fiber Bragg Gratings is written directly in the step index core.

7. The laser of claim 5, wherein at least one of the Fiber Bragg Gratings is written directly in the graded index core.

8. The laser of claim 1 has external optics that form a resonator.

9. The laser of claim 1, wherein the Fiber Bragg gratings are configures as a sequence of Fiber Bragg Gratings that define a single shifted output wavelength.

10. The laser of claim 1, wherein the Fiber Bragg gratings are configures as a sequence of Fiber Bragg Gratings that defines multiple cavities which results in multiple output wavelengths.

11. The laser of claim 1, further comprising a high numerical aperture clad surrounding a step index multimode core.

12. The laser in claim 1 has a high numerical aperture clad surrounding a graded index multimode core.

13. The laser of claim 1, wherein the laser is configured to provide multiple output wavelengths that create three ideal wavelengths for viewing a projection display in dim background illumination.

14. The lasers of claim 1, wherein the laser is configured to provide multiple output wavelengths that create three ideal wavelengths for viewing a projection display in a bright background illumination.

15. A display system having one or more of the lasers of claim 1.

16. An illumination system having one or more of the lasers of claim 1.

17. The illumination system of claim 16, wherein the illumination system is located at a drive-in movie theater.

18. The illumination system of claim 16, wherein the illumination system is located at a sporting event.

19. The illumination system of claim 18, comprising a display, having a picture size of at least 50 feet by 50 feet.

20. The illumination system of claim 16, wherein the illumination system is located at an amusement park.

21. The illumination system of claim 16, wherein the illumination system is located at a body of water.

22. The illumination system of claim 21, wherein the body of water is located at a water park.

23. The illumination system of claim 16, wherein the illumination system is located at a location selected from the group consisting of a theater, an amphitheater, a harbor, an airport, a rail yard, a concert venue, a harbor, and a road way.

24. A method wherein the illumination system of claim 16, illuminations an object.

25. The method of claim 24, wherein the object is selected from the group consisting of a drive-in movie screen, a building, a bridge, a screen, a cloud or vapor, a structure, a vehicle, a surface, or an opaque surface.

26. The system of claim 1, wherein one, two, or three of the wavelengths of the three primary color laser beams are selected based upon peak sensitivity for Photopic visual sensitivity.

27. The system of claim 1, wherein one, two, or three of the wavelengths of the three primary color laser beams are selected based upon peak sensitivity for Scotopic visual sensitivity.

28. The system of claims 1, wherein the system is adjustable to provide one, two, or three of the wavelengths of the three primary color laser beams selected based upon peak sensitivity for Scotopic or Photopic visual sensitivity.

* * * * *